US006583397B2

(12) United States Patent
Vo-Dinh

(10) Patent No.: US 6,583,397 B2
(45) Date of Patent: Jun. 24, 2003

(54) SERODS OPTICAL DATA STORAGE WITH PARALLEL SIGNAL TRANSFER

(75) Inventor: Tuan Vo-Dinh, Knoxville, TN (US)

(73) Assignee: UT-Battelle, LLC, Oak Ridge, TN (US)

( * ) Notice: Subject to any disclaimer, the term of this patent is extended or adjusted under 35 U.S.C. 154(b) by 18 days.

(21) Appl. No.: 09/909,267

(22) Filed: Jul. 19, 2001

(65) Prior Publication Data

US 2003/0016614 A1 Jan. 23, 2003

(51) Int. Cl.⁷ .............................................. G02B 27/40
(52) U.S. Cl. ................ 250/201.5; 250/235; 250/208.1; 356/457
(58) Field of Search ............................. 250/208.1, 204, 250/207, 216, 226, 227.19, 227.2, 235, 201.5; 346/107.1; 341/13, 14, 31; 342/52; 356/222, 343, 435, 457; 359/115; 365/112, 114, 216, 234; 369/44.38, 47.1, 100, 43, 44.11, 44.26, 44.33; 382/254, 260, 263; 712/208, 221

(56) References Cited

U.S. PATENT DOCUMENTS

| | | | |
|---|---|---|---|
| 4,999,810 A | | 3/1991 | Vo-Dinh |
| 5,325,342 A | | 6/1994 | Vo-Dinh |
| 6,174,677 B1 | * | 1/2001 | Vo-Dinh ........................ 435/6 |

OTHER PUBLICATIONS

T. Vo–Dinh, "Surface Enhanced Raman Spectroscopy Using Metallic Nanostructures", Trends in Analytical Chemistry, vol. 17., (No. 8,9), pp. 557–582, (1998).*

Emerging Optical Storage Technologies, Chapter 3, Loyola Univ. 4 pages; HTML published Feb. 1996 at http://itri.loyola.edu/opto/c3_s5.htm.

T. Vo–Dinh, "Principle of SERODS: A New Concept for Optical Data Storage", Proc. 1994 Spring Conf. on Solid State Memory Techologies, Pasadena, CA, May 23–25, 1994, pp. app. 101–110.

Tuan Vo–Dinh, "SERODS: Principle of a New Optical Data Storage System", Optical Data Storage, D. Campbell, M. Chen and K. Ogawa, Eds., pp. 148–155, (1994). SPIE vol. 2338.

T. Vo–Dinh, et al, "Surface–Enhanced Raman Optical Data Storage: A New Optical Memory with Three–Dimensional Data Storage", Review Sci. Instrum., vol. 65 (No. 12), pp. 3766–3770, (Dec. 1994).

T. Vo–Dinh, "Surface Enhanced Raman Scattering," Photonic Probes of Surfaces, pp. 65–95, (1995). P. Halevi, Ed., Elsevier, New York.

T. Vo–Dinh, "Surface Enhanced Raman Spectroscopy Using Metallic Nanostructures", Trends in Analytical Chemistry, vol. 17 (No. 8,9) pp. 557–582, (1998).

* cited by examiner

Primary Examiner—David Porta
Assistant Examiner—Patrick J Lee
(74) Attorney, Agent, or Firm—James M. Spicer

(57) ABSTRACT

Surface-enhanced Raman optical data storage (SERODS) systems having increased reading and writing speeds, that is, increased data transfer rates, are disclosed. In the various SERODS read and write systems, the surface-enhanced Raman scattering (SERS) data is written and read using a two-dimensional process called parallel signal transfer (PST). The various embodiments utilize laser light beam excitation of the SERODS medium, optical filtering, beam imaging, and two-dimensional light detection. Two- and three-dimensional SERODS media are utilized. The SERODS write systems employ either a different laser or a different level of laser power.

109 Claims, 16 Drawing Sheets

SERODS OPTICAL DATA STORAGE WITH PARALLEL SIGNAL TRANSFER

STATEMENT REGARDING FEDERALLY SPONSORED RESEARCH OR DEVELOPMENT

The United States Government has rights in this invention pursuant to Contract No. DE-AC05-00OR22725 between the United States Department of Energy and UT-Battelle, LLC.

BACKGROUND OF THE INVENTION

1. Field of the Invention

The invention relates to high-density optical data storage systems. More particularly, it relates to improvements in Surface-Enhanced Raman Optical Data Storage (SERODS) systems that make possible the reading and writing of large amounts of surface-enhanced Raman scattering (SERS) data at very fast rates.

2. Background Information

Surface-Enhanced Raman Optical Data Storage (SERODS) systems based on the surface-enhanced Raman scattering (SERS) effect are a recent development in the field of high-density optical data storage. See, for example, the inventor's U.S. Pat. No. 4,999,810, Issued Mar. 12, 1991; and his U.S. Pat. No. 5,325,342, Issued Jun. 28, 1994.

In these systems, the information is recorded on some form of SERODS medium. This is usually a two-dimensional (2-D) SERODS disk or a three-dimensional (3-D) stack of two-dimensional SERODS disks. Monolithic multilayer 3-D optical disks, which could contain SERS data, are also known. A single SERODS disk usually comprises at least a flat, optically transparent substrate having two opposed faces. A SERS-active coating is placed on at least one of the faces. A writing process such as the one described in the above patents embeds information (data) in the SERS-active coating. The embedded SERS data is termed microspots, although their size could be in the sub-micron or nanometer range, and be referred to as "nanospots". While such systems have demonstrated excellent high-density optical data storage capability, it is desirable to increase their reading speed and data transfer rate significantly.

The present invention provides means for ultrafast transfer of large amounts of data in both the writing and reading processes in SERODS systems. This new capability is called parallel signal transfer, or PST. The PST enhancement to SERODS systems will be useful for applications that require huge memory capacity with ultrafast parallel data writing, reading and transfer.

The SERS technology is based on the principle that the enhanced Raman light-emitting properties of certain molecules (usually dye molecules) embedded in an optical medium can be altered at the molecular level to store information. Normal Raman signals are generally very weak and cannot be easily detected. The SERS effect, however, can enhance the Raman signal up to $10^8$ times, and make Raman detection possible for optical data reading with the SERODS technology. The basic principles of the SERS effect have been recently discussed. See, for example, T. Vo-Dinh, "Surface-Enhanced Raman Scattering", in Photonic Probes of Surfaces, P. Halevi, Ed., Elsevier, N.Y. (1995).

With the SERODS technology, the molecular interactions between the optical-layer molecules and the substrate are modified by the writing laser, changing their SERS-emitting properties so that they are encoded to store information as bits. The intensity of the SERS signal of a chemical deposited on a substrate depends strongly on its molecular interaction with the substrate microenvironment adjacent to it. The basic operating principle of SERODS is to alter this chemical/substrate interaction at the molecular level in a laser "write-on" process, and to monitor the change in the SERS signal intensity of molecules in the optical layer in a "read-out" process that uses laser irradiation or other means.

The embedded information is recovered from the recorded medium by detecting the changes in the SERS signal from the altered molecules by a photodetector that tracks the changes in the amplitude and spatial distribution of the SERS signal from different microregions on the disk.

In the conventional SERODS systems, a scanning device such as a photodetector is used for sequential data reading. However, the reading speed of such SERODS systems is limited by the scanning speed of the mechanical device, i.e., the disk rotation speed and the disk scanning system.

In contrast, the present invention is a system for writing or reading SERS data by using a two-dimensional writing or reading process called parallel signal transfer, or PST. This is an improvement to the present SERODS systems which utilize a scanning process where the SERS signal of each written bit is read sequentially one at a time. The PST reading process involves two-dimensional data reading with simultaneous detection of all information bits written on one entire two-dimensional (2-D) SERODS disk.

The following example illustrates the advantages of the PST improvement. With a sequential scanning SERODS system, a reading time, or SERS signal integration time of 0.1 $\mu$sec per data produces a reading speed of 10 Mbit/sec. On the other hand, a SERODS system with PST would transfer $10^6$ bits simultaneously using a longer integration time of 1 msec. This is a reading speed of 1 Gigabit/sec, which is 100 times faster than the conventional sequential scanning system.

References

1. Emerging Optical Storage technologies, Chapter 3, Loyola University, 4 pages; HTML published February 1996 at http://itri.loyola.edu/opto/c3_s5.htm.
2. T. Vo-Dinh., Surface Enhanced RAMAN Optical Data Storage System, U.S. Pat. No. 4,999,810, Issued Mar. 12, 1991.
3. T. Vo-Dinh, Surface Enhanced RAMAN Optical Data Storage System, U.S. Pat. No. 5,325,342, Issued Jun. 28, 1994.
4. T. Vo-Dinh, "Principle of SERODS: A New Concept for Optical Data Storage", Proc. 1994 Spring Conference on Solid-State Memory Technologies, Pasadena, Calif., May 23–25 (1994), Appendix pages 101–110.
5. T. Vo-Dinh, "SERODS: Principle of a New Optical Data Storage System" in Optical Data Storage, D. Campell, M. Chen and K. Ogawa, Eds., SPIE Vol. 2338, Bellingham, Wash. (1994), pp. 148–155.
6. T. Vo-Dinh and D. L. Stokes, "Surface-Enhanced Raman Optical Data Storage: A New Optical Memory with Three-Dimensional Data Storage", Rev. Sci. Instrum., 65(12), (December 1994), pp. 3766–3770.
7. T. Vo-Dinh, "Surface-Enhanced Raman Scattering", in Photonic Probes of Surfaces, P. Halevi, Ed., Elsevier, N.Y. (1995), pp. 65–95.
8. T. Vo-Dinh, "Surface-Enhanced Raman Spectroscopy Using Metallic Nanostructures", Trends in Analytical Chemistry, 17(8&9), (1998), pp. 557–582.

OBJECTS OF THE INVENTION

It is a first object of the invention to provide improved writing and reading systems for two-dimensional single or stacked SERODS disks and for three-dimensional SERODS media.

A second object of the invention is to provide data reading speeds (transfer rates) in SERODS writing and reading systems in the Megabit and Gigabit ranges.

BRIEF SUMMARY OF THE INVENTION

A parallel signal transfer system (PSTS) for reading a surface-enhanced Raman optical data storage (SERODS) medium has: a laser providing an optical light beam to the SERODS medium, the laser adapted to produce a two-dimensional surface-enhanced Raman scattering (SERS) optical light image signal from the SERODS medium; a two-dimensional detector receiving the 2-D SERS optical light image signal, the two-dimensional detector adapted for producing a 2-D image of the 2-D SERS optical light image signal; a holographic notch filter positioned between the SERODS medium and the two-dimensional detector, the holographic notch filter rejecting the Raleigh scatter from the two-dimensional SERS optical light image signal; and imaging optics positioned at the entrance to the two-dimensional detector, the imaging optics adapted to focus the two-dimensional SERS optical light image signal onto the two-dimensional detector.

Another parallel signal transfer system (PSTS) for reading a surface-enhanced Raman optical data storage (SERODS) medium has: a microreader system adapted for placement of the SERODS medium therein; a laser providing an optical light beam to the SERODS medium in the microreader system, the laser adapted to produce a two-dimensional surface-enhanced Raman scattering (SERS) optical light image signal from the SERODS medium; a combined spatial filter and beam expansion module positioned between the laser and the microreader system, the combined spatial filter and beam expansion module adapted to expand and re-collimate the optical light beam from the laser; a two-dimensional detector receiving the 2-D SERS optical light image signal from the microreader system, the two-dimensional detector adapted for producing a 2-D image of the 2-D SERS optical light image signal; an optical lens system positioned between the microreader system and the 2-D detector for projecting the 2-D SERS optical light image signal onto the 2-D detector; and a holographic notch filter positioned between the optical lens system and the 2-D detector, the holographic notch filter rejecting the Raleigh scatter from the two-dimensional SERS optical light image signal.

Another parallel signal transfer system (PSTS) for reading a surface-enhanced Raman optical data storage (SERODS) medium has: a laser providing an optical light beam to the SERODS medium, the laser adapted to produce a two-dimensional surface-enhanced Raman scattering (SERS) optical light image signal from the SERODS medium; a beam shaping lens system positioned in the optical light beam, the beam shaping lens system adapted to produce evanescent wave excitation in the SERODS medium; a two-dimensional detector receiving the 2-D SERS optical light image signal, the two-dimensional detector adapted for producing a 2-D image the 2-D SERS optical light image signal; a holographic notch filter positioned between the SERODS medium and the two-dimensional detector, the holographic notch filter rejecting the Raleigh scatter from the two-dimensional SERS optical light image signal; and imaging optics positioned at the entrance to the two-dimensional detector, the imaging optics adapted to focus the two-dimensional SERS optical light image signal onto the two-dimensional detector.

Another parallel signal transfer system (PSTS) for reading a surface-enhanced Raman optical data storage (SERODS) medium has: a laser providing an optical light beam to the SERODS medium, the laser adapted to produce a two-dimensional surface-enhanced Raman scattering (SERS) optical light image signal from the SERODS medium; a beam shaping lens system positioned in the optical light beam, the beam shaping lens system adapted to produce evanescent wave excitation in the SERODS medium; a two-dimensional detector receiving the 2-D SERS optical light image signal, the two-dimensional detector adapted for producing a 2-D image the 2-D SERS optical light image signal; a holographic notch filter positioned between the SERODS medium and the two-dimensional detector, the holographic notch filter rejecting the Raleigh scatter from the two-dimensional SERS optical light image signal; and imaging optics positioned at the entrance to the two-dimensional detector, the imaging optics adapted to focus the two-dimensional SERS optical light image signal onto the two-dimensional detector; a second laser providing a second optical light beam to the SERODS medium, the second laser adapted to produce a second two-dimensional surface-enhanced Raman scattering (SERS) optical light image signal from the SERODS medium; and a second beam shaping lens system positioned in the second optical light beam, the second beam shaping lens system adapted to produce evanescent wave excitation in the SERODS medium.

Another parallel signal transfer system (PSTS) for reading a three dimensional surface-enhanced Raman optical data storage (SERODS) medium has: a laser providing multiple optical light beams to the SERODS medium, the laser adapted to produce multiple two-dimensional surface-enhanced Raman scattering (SERS) optical light image signals from the SERODS medium; diffraction optics positioned in the optical light beam, the diffraction optics adapted to produce multiple optical light beams that produce multiple evanescent wave excitations in the SERODS medium from edge illumination of the SEROD medium; and a two-dimensional detector receiving the multiple 2-D SERS optical light image signals, the 2-D detector having multiple wavelength sensing elements, each sensing element comprising a plurality of microsensors adapted for detecting at a specific wavelength, the 2-D detector adapted for processing the signals from the plurality of microsensors to produce multiple 2-D images of the 2-D SERS optical light image signals.

Another parallel signal transfer system (PSTS) for reading a three dimensional surface-enhanced Raman optical data storage (SERODS) medium has: a laser providing multiple optical light beams to the SERODS medium, the laser adapted to produce multiple two-dimensional surface-enhanced Raman scattering (SERS) optical light image signals from the SERODS medium; diffraction optics positioned in the optical light beam, the diffraction optics adapted to produce multiple optical light beams that produce multiple evanescent wave excitations in the SERODS medium from face illumination of the SEROD medium; and a two-dimensional detector receiving the multiple 2-D SERS optical light image signals, the 2-D detector having multiple wavelength sensing elements, each sensing element comprising a plurality of microsensors adapted for detecting at a specific wavelength, the 2-D detector adapted for processing the signals from the plurality of microsensors to produce multiple 2-D images of the 2-D SERS optical light image signals.

Another parallel signal transfer system (PSTS) for reading a three dimensional surface-enhanced Raman optical data storage (SERODS) medium has: a laser providing multiple optical light beams to the SERODS medium, the laser adapted to produce multiple two-dimensional surface-enhanced Raman scattering (SERS) optical light image signals from the SERODS medium; diffraction optics positioned in the optical light beam, the diffraction optics adapted to produce multiple optical light beams that produce multiple evanescent wave excitations in the SERODS medium from edge illumination of the SEROD medium; and a two-dimensional detector receiving the multiple 2-D SERS optical light image signals, the 2-D detector having multiple sections of sensing elements, each section having wavelength selective elements for detecting at a specific wavelength, the 2-D detector adapted for processing the signals from the detection sections to produce multiple 2-D images of the 2-D SERS optical light image signals.

Another parallel signal transfer system (PSTS) for reading a surface-enhanced Raman optical data storage (SERODS) medium has: a pulsed laser providing optical light pulses to the SERODS medium, the laser adapted to produce a two-dimensional surface-enhanced Raman scattering (SERS) optical light image signal from the SERODS medium; a beam splitter for splitting the optical light pulses into first and second pulsed beams; a cylindrical mirror system positioned in the first pulsed beam path, the cylindrical mirror system adapted for spreading the first pulsed beam into a 2-D excitation plane; an optical delay positioned in the second pulsed beam path, the optical delay adapted for producing pulse overlap with the first pulsed beam for two-photon excitation in the SERODS medium; a two-dimensional detector receiving the two-dimensional SERS optical light image signal, the two-dimensional detector adapted for producing a 2-D image of the 2-D SERS optical light image signal; and a holographic notch filter positioned between the SERODS medium and the two-dimensional detector, the holographic notch filter rejecting the Raleigh scatter from the two-dimensional SERS optical light image signal.

Another parallel signal transfer system (PSTS) for reading a surface-enhanced Raman optical data storage (SERODS) medium has: a first pulsed laser providing a first pulsed optical light beam to the SERODS medium, the laser adapted to produce a two-dimensional surface-enhanced Raman scattering (SERS) optical light image signal from the SERODS medium; a cylindrical mirror system positioned in the first pulsed optical light beam path, the cylindrical mirror system adapted for spreading the first pulsed beam into a 2-D excitation plane; a second pulsed laser providing a second pulsed optical light beam to the SERODS medium, the laser adapted to produce a two-dimensional surface-enhanced Raman scattering (SERS) optical light image signal from the SERODS medium; an optical delay positioned in the second pulsed beam path, the optical delay adapted for producing pulse overlap with the first pulsed beam for two-photon excitation in the SERODS medium; a two-dimensional detector receiving the two-dimensional SERS optical light image signal, the two-dimensional detector adapted for producing a 2-D image of the 2-D SERS optical light image signal; and a holographic notch filter positioned between the SERODS medium and the two-dimensional detector, the holographic notch filter rejecting the Raleigh scatter from the two-dimensional SERS optical light image signal.

Another parallel signal transfer system (PSTS) for reading a surface-enhanced Raman optical data storage (SERODS) medium has: a laser providing an optical light beam to the SERODS medium, the laser adapted to produce a two-dimensional surface-enhanced Raman scattering (SERS) optical light image signal from the SERODS medium; a beam splitter for splitting the optical light beam into first and second optical light beams; a cylindrical mirror system positioned in the first optical light beam path, the cylindrical mirror system adapted for spreading the first optical light beam into a 2-D excitation plane; an acousto-optic modulator positioned in the second optical light beam path, the acousto-optic modulator adapted for deflecting the second optical light beam; an optical delay positioned in the second optical light beam path, the optical delay adapted for producing overlap with the first optical light beam for two-photon excitation in the SERODS medium; a two-dimensional detector receiving the two-dimensional SERS optical light image signal, the two-dimensional detector adapted for producing a 2-D image of the 2-D SERS optical light image signal; and a holographic notch filter positioned between the SERODS medium and the two-dimensional detector, the holographic notch filter rejecting the Raleigh scatter from the two-dimensional SERS optical light image signal.

Another parallel signal transfer system (PSTS) for reading a surface-enhanced Raman optical data storage (SERODS) medium has: a laser providing a first optical light beam to the SERODS medium, the laser adapted to produce a two-dimensional surface-enhanced Raman scattering (SERS) optical light image signal from the SERODS medium; a cylindrical mirror system positioned in the first optical light beam path, the cylindrical mirror system adapted for spreading the first optical light beam into a 2-D excitation plane; a second laser providing a second optical light beam to the SERODS medium, the laser adapted to produce a two-dimensional surface-enhanced Raman scattering (SERS) optical light image signal from the SERODS medium; an acousto-optic modulator positioned in the second optical light beam path, the acousto-optic modulator adapted for deflecting the second optical light beam; an optical delay positioned in the second optical light beam path, the optical delay adapted for producing overlap with the first optical light beam for two-photon excitation in the SERODS medium; a two-dimensional detector receiving the two-dimensional SERS optical light image signal, the two-dimensional detector adapted for producing a 2-D image of the 2-D SERS optical light image signal; and a holographic notch filter positioned between the SERODS medium and the two-dimensional detector, the holographic notch filter rejecting the Raleigh scatter from the two-dimensional SERS optical light image signal.

DETAILED DESCRIPTION OF THE INVENTION

Embodiment No. 1

Figure 1:
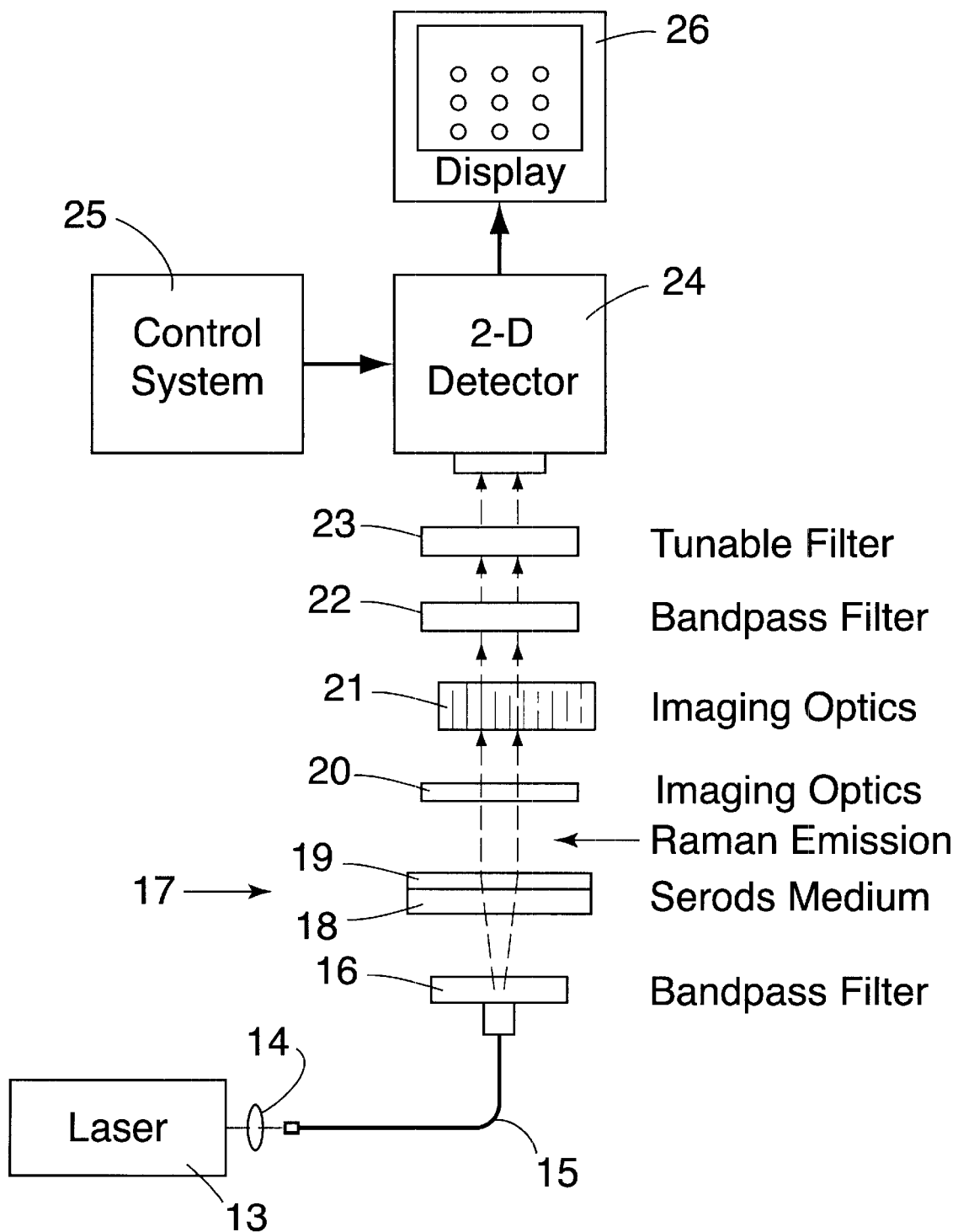
FIG. 1 illustrates a first embodiment of a SERODS system with parallel signal transfer that utilizes face excitation of a transparent SERODS disk.

A first embodiment of a SERODS reading system with parallel signal transfer, or PST, utilizes face excitation of a transparent SERODS disk, and is illustrated by the block diagram of FIG. 1.

In FIG. 1, focusing optics 14 are used to focus the beam of a laser 13 onto the entrance end of an optical fiber 15. The laser 13 can be, for example, a semiconductor laser or a gas laser such as a krypton laser. A divergent laser light beam exits the optical fiber 15 to pass through a bandpass filter 16, which rejects the Raman scattering of the optical fiber 15.

The light beam passes through the SERODS medium 17, which is ordinarily a SERODS disk comprising an optically transparent substrate 18 with a SERS-active coating 19 on one face thereof. The coating has information bits embedded therein which may be in the form of microspots or nanospots. The SERODS medium 17 is not limited to a two-dimensional disk, but could comprise a stack of disks or a three-dimensional SERODS medium. The light beam exiting the bandpass filter 16 enters one face of the transparent SERODS disk 17, excites the SERS-active optical coating 19, and passes through the other face of the disk. The resulting Raman scattered light out of the disk 17 is a two-dimensional image of the surface of the SERS-active optical coating 19. This is one of several embodiments of parallel signal transfer that is provided by this invention.

The first element in the SERS collection path after the SERODS disk 17 is a holographic notch filter 20. The holographic notch filter 20 rejects the laser (Raleigh) scatter from the 2-D SERS optical light image signal. The filtered 2-D image of the SERODS disk 17 data is next focused onto a two-dimensional detector 24 by means of appropriate imaging optics 21. Optionally, a bandpass filter 22 or a tunable filter 23 could be placed before the detector 24 if needed to select the Raman wavelength. The two-dimensional detector 24 shown in FIG. 1 may be a liquid nitrogen-cooled charge-coupled device (CCD) camera. The detector could also be an intensified CCD (ICCD), a charge injection device (CID), a CMOS detector such as a photodiode array, or any suitable 2-D photometric detector system. The imaging optics 21 in FIG. 1 could be, for example, a 1"×3" GRIN lens array. Alternatively, the imaging optics 21 could be a diffractive optics lens arrangement. The control system 25 in FIG. 1 is the control system associated with the two-dimensional detector 24. The output of the detector 24 is the two-dimensional image of the SERS data from the SERODS medium 17. An example of such a 2-D image of the SERS data is indicated in the two-dimensional display device 26 of FIG. 1, and shown in more detail in FIG. 2.

In the embodiment shown in FIG. 1, the optical fiber 15 is used only for convenience to transmit the beam from the laser 13. The laser light beam can be transmitted directly onto the SERODS disk 17 without the use of the optical fiber 15 or bandpass filter 16 if desired. The optical fiber 15 and bandpass filter 16 in the embodiment of FIG. 1 may be optionally used in the further embodiments of the invention as well. The bandpass filter 22 and tunable filter 23, which are also optional in the embodiment of FIG. 1, are likewise optional in the other embodiments of the invention hereinafter described.

In operation, the light beam from the laser 13 in FIG. 1 is input onto the entrance end of the optical fiber 15 by means of the focusing optics 14. The light beam diverges upon exiting the optical fiber 15, and passes through the bandpass filter 16 where the Raman scattering emission from the optical fiber 15 is rejected. The laser beam excites the optical layer molecules in the SERS-active coating 19 on the transparent SERODS disk 17 to produce a two-dimensional Raman scattering image of the SERS-active optical coating 19.

The image-containing light beam passes through the holographic notch filter 20 where the Raleigh scatter is removed from the Raman signal. The two-dimensional image is then focused onto the two-dimensional detector 24 by means of the 1"×3" GRIN lens array 21. The detector 24 produces the two-dimensional display of the SERS data, shown in the 2-D display device 26 in FIG. 1, and also in FIG. 2.

Figure 2:
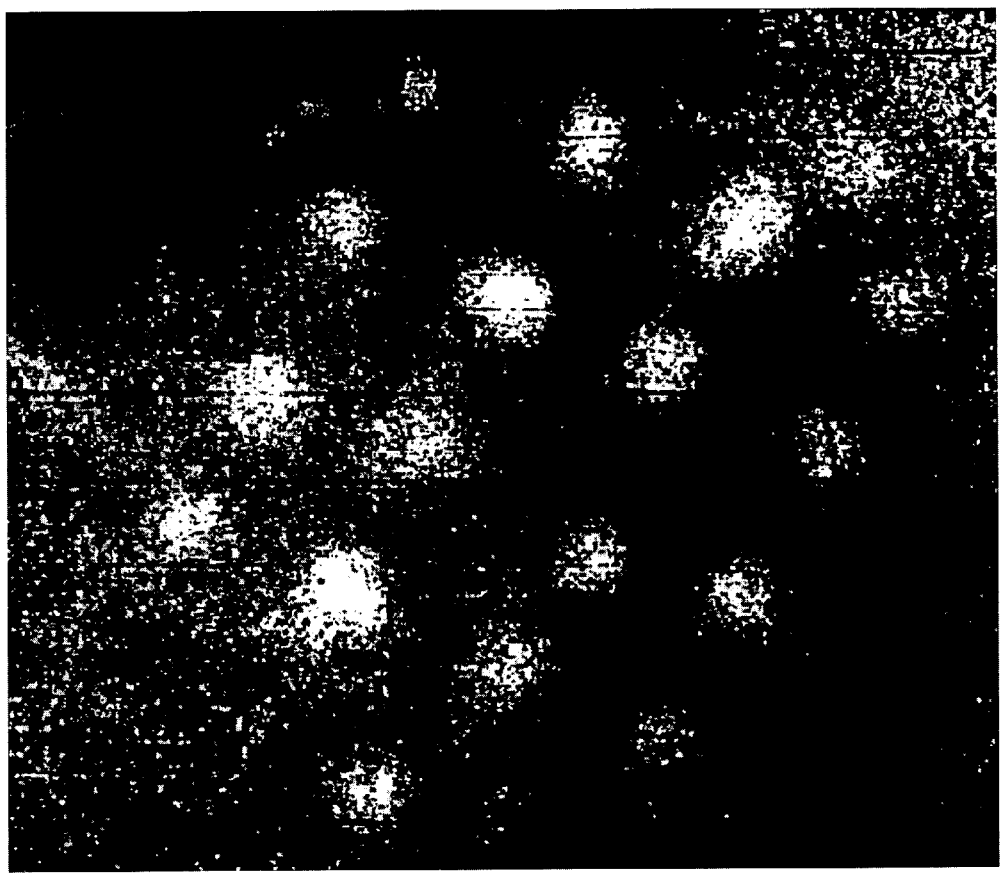
FIG. 2 is a photomicrograph of a typical two-dimensional display of SERS data produced by the SERODS system of FIG. 1.

FIG. 2 is a photomicrograph of a typical two-dimensional display of SERS data produced with the SERODS system of FIG. 1. In FIG. 2, the SERS signals are those of a 4×4 array of microspots (spot size: 500-$\mu$m diameter) of SERS-active chemicals used as the SERODS disk coating. FIG. 2 illustrates the simultaneous two-dimensional parallel recording capability, or parallel signal transfer capability, of the invention. FIG. 2 is interesting in another regard. Instead of using a disk with the usual SERODS holes, this two-dimensional SERS image was obtained by depositing microspots of a coating chemical (p-aminobenzoic acid—PABA, $10^{-3}$ M) using a micro-injection device. Following deposition of the 4×4 array of microspots on the SERODS disk, the two-dimensional image of FIG. 2 was recorded using the system shown in FIG. 1.

Embodiment No. 2

Figure 3:
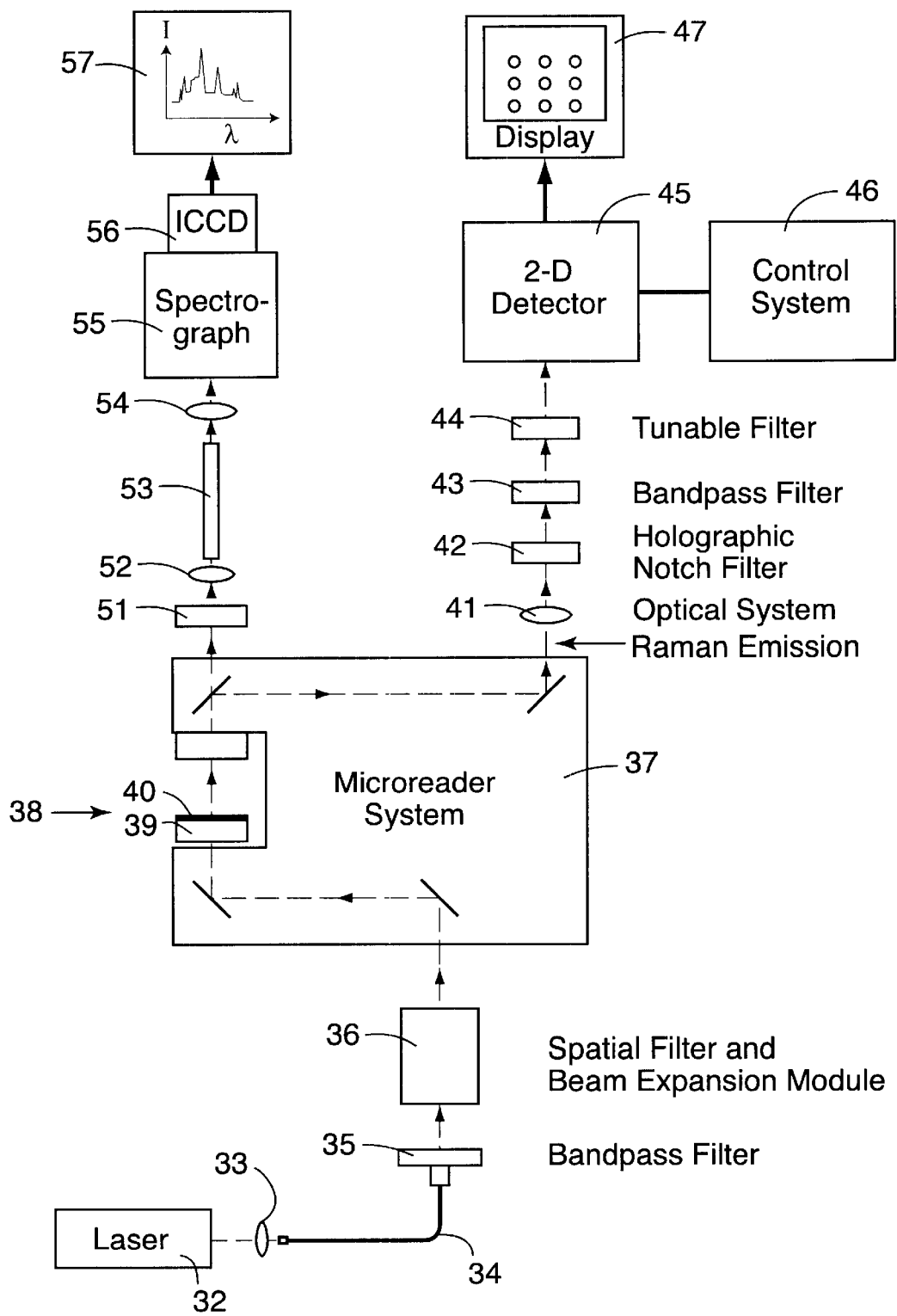
FIG. 3 illustrates a second embodiment of a SERODS system with parallel signal transfer that also uses face excitation of a transparent SERODS disk.

A second embodiment of a SERODS system with parallel signal transfer (PST), that also uses face excitation of a transparent SERODS disk, is shown in block diagram form in FIG. 3. In FIG. 3, a helium-neon laser 32 generates the excitation beam. After passing through a bandpass filter 35, the optical light beam from the laser 32 is expanded and recollimated using a combined spatial filter and beam expansion module 36. The laser beam is then input to the entrance aperture of a microreader system 37. The microreader system 37 can be a two-dimensional imaging recorder or a near-field microscope reader system, for example.

In the microreader system 37, it is essential to have sufficient magnification power to distinguish the SERS microspots or nanospots. In the microreader system, the laser beam is collimated by a condenser lens and focused onto a SERODS disk 38 placed in the microscope viewing field. In this example, a 50x objective lens in the microreader system 37 was used to focus and transmit the 2-D SERS optical light image signal through a first microscope image exit port to an external optical system 41 for projecting SERODS images onto a 2-D detector 45. The 2-D detector 45 may be a CCD camera, for example, which is used to record the 2-D SERODS images. Laser scatter (Raleigh) rejection is accomplished by placing a holographic notch filter 42 in the detection path before the 2-D detector 45.

In addition to the novel two-dimensional SERODS display just described, it is convenient to also employ a conventional spectrum display of the SERS spectra. FIG. 3 also illustrates this additional data display means. In FIG. 3, the 2-D SERS optical light image signal also exits the microreader system 37 through a second beam exit port where it passes through the second holographic notch filter 51. The holographic notch filter 51 is used to reject the laser (Raleigh) scatter from the 2-D SERS optical light image signal. Focusing optics 52 focus the image signal into an optical fiber 53. The SERS image signal is transmitted via the optical fiber 53 and focused onto the emission slit of a spectrograph 55 by means of focusing optics 54. The spectrograph 55 may be equipped with a thermo-electrically cooled, red-enhanced, intensified CCD (ICCD) 56, for example. A display device 57 provides the spectrum display, thereby providing a practical addition to the microreader system in that both types of displays can be presented to the user simultaneously.

Figure 4:
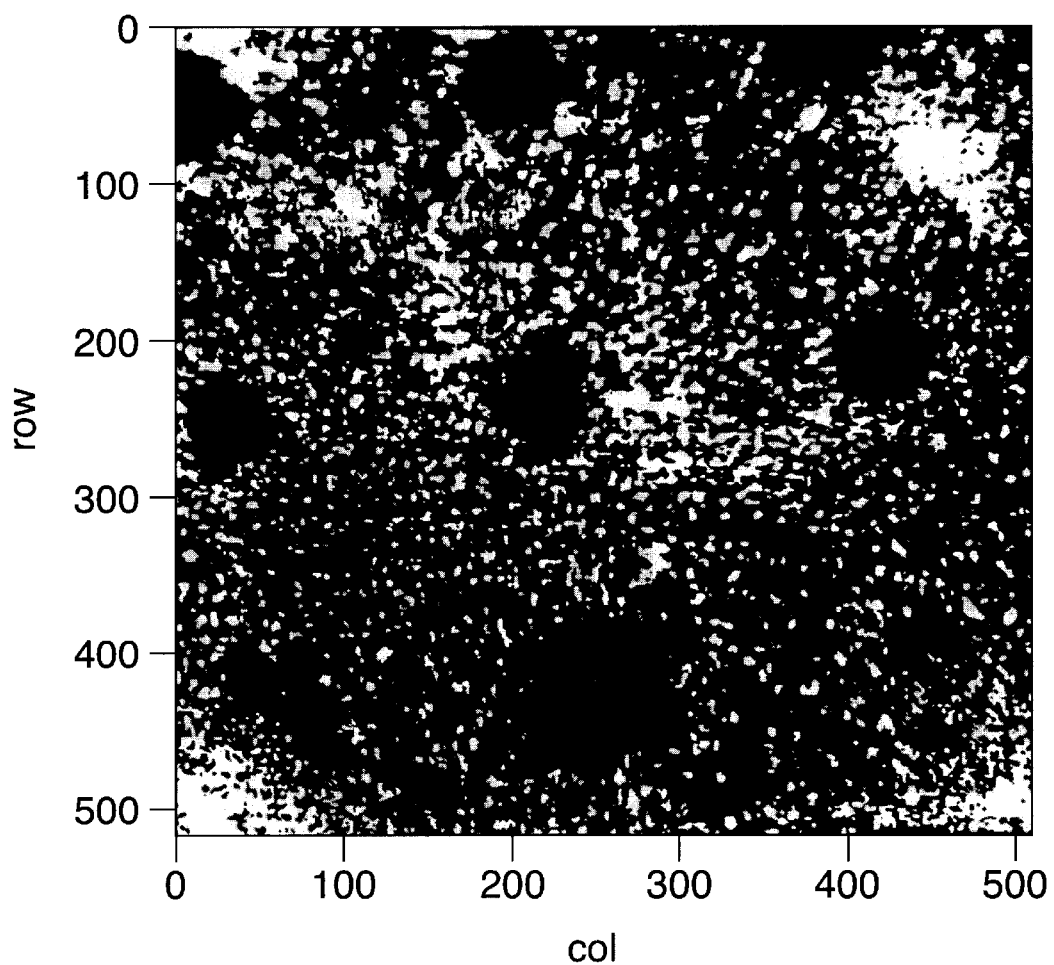
FIG. 4 is a 2-D image of a SERODS disk written with a 3×3 array pattern of SERODS holes.

FIG. 4 shows a 2-D image of a SERODS disk written with a 3×3 array pattern of holes using the laser write process described in previous U.S. Pat. No. 4,999,810, and U.S. Pat. No. 5,325,342. The data of FIG. 4 demonstrates the parallel signal transfer, i.e., parallel data reading, of a 2-D SERODS disk having actual SERODS holes.

The SERODS disk used in producing FIG. 4 comprised an alumina-based SERS substrate prepared by using previously described procedures. This was a glass disk coated with 0.1 $\mu$m-diameter alumina particles, coated with a 100-nm layer of silver. In this process in general, a 50-$\mu$L volume of a suspension of alumina nanoparticles is applied to the surface of the test substrate (e.g., a glass slide). The substrate is then placed on a high-speed spinning device and spun at 800 to 2000 rpm for about 20 seconds. The silver is deposited on the nanosphere-coated substrate in a vacuum evaporator at a deposition rate of 0.2 nm/s. The thickness of the deposited silver layer is generally 50 to 100 nm. The chemical coating was crystal fast violet (CFV, 1 $\mu$l sample of 250 ppm in ethanol). The sample spot spread to a surface area of approximately of 0.4 cm$^2$. A krypton laser (50 mW, Coherent model Innova 70) was used to encode SERODS hole patterns on the substrate. Precise positioning of the SERODS disk across the write beam was performed using micro-translation stages. The distance between the SERODS holes in FIG. 2b is 75 $\mu$m. The signal integration time used to record the 200 $\mu$m×200 $\mu$m image shown in FIG. 4 was 3 seconds.

Figure 5:
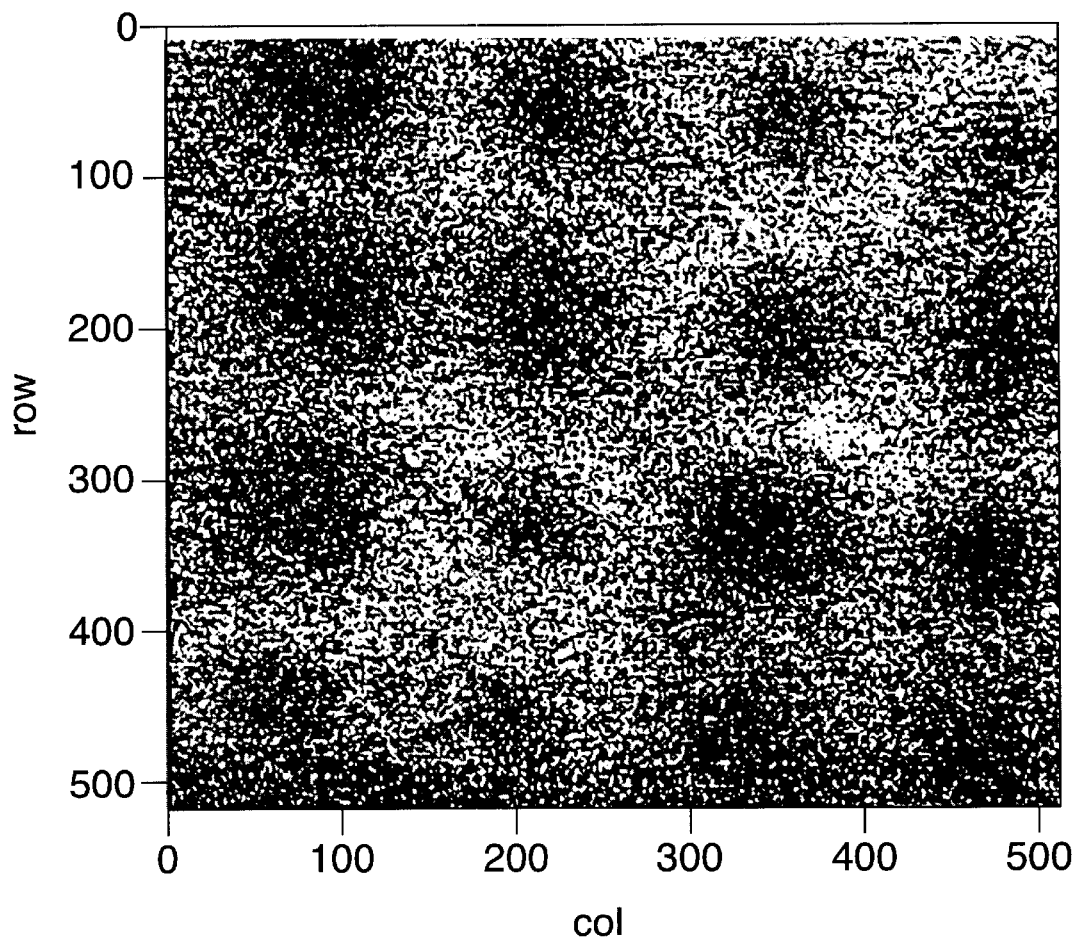
FIG. 5 is a 2-D image of a SERODS disk written with a 4×4 array of SERODS holes read in only 1 msec using a liquid-nitrogen cooled CCD system.
Figure 6:
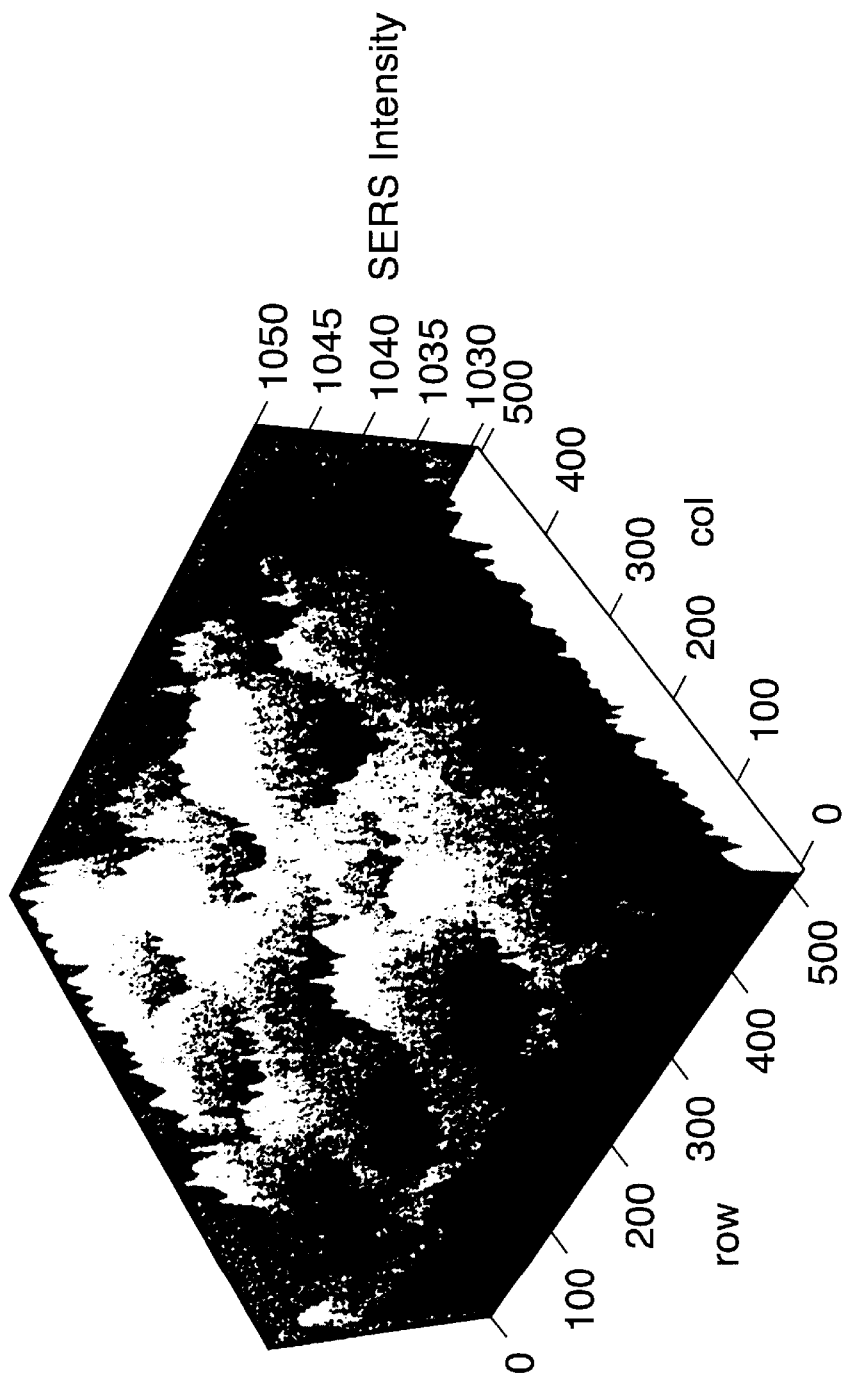
FIG. 6 is a 3-D plot of the data of FIG. 5.
Figure 7:
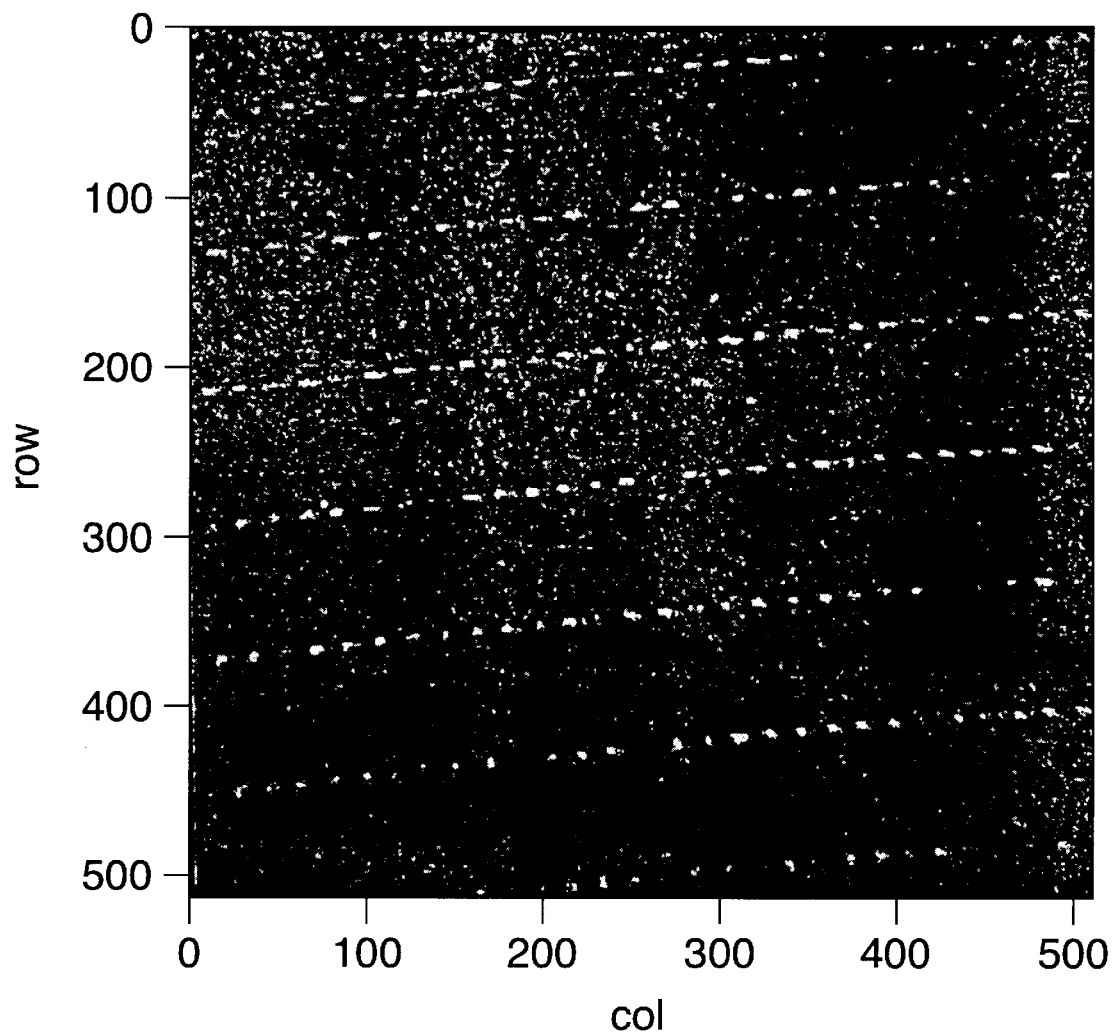
FIG. 7 is a 2-D image of SERODS hole patterns written onto a SERODS disk in serial form.

FIGS. 5, 6, 7 further demonstrate the potential of the SERODS-PST reading speed. They show the SERODS-PST signal of a 4×4 array of SERODS holes read in only 1 msec using a liquid-nitrogen cooled CCD system. FIG. 5 shows the image recorded by the CCD camera, and FIG. 6 is a 3-D plot of the same data. The SERODS holes of FIGS. 5–6 are 40 $\mu$m in diameter, but much smaller SERODS holes of 0.3 to 0.4 $\mu$m diameter can be produced. See, for example, T. Vo-Dinh and D. L. Stokes, "Surface-Enhanced Raman Optical data Storage: A New Optical memory with Three-Dimensional Data Storage", Rev. Sci. Instrum., 65(12), 3766–3770 (December 1994).

The results of FIGS. 5–6 demonstrate the feasibility of a very high parallel signal transfer or data transfer rate. With a 1000×1000 array CCD, a SERODS disk can be read in 1 msec, thus producing a data rate reading of 1 Gigabit/sec. With the use of a 4,000×4,000 (4K×4K) CCD detector, it is possible to achieve a 16 Gigabit/sec reading rate. Furthermore, with the use of a 10$^4$×10$^4$ (10K×10K) array CCD detector, the reading rate could be 100 gigabit/sec.

FIG. 7 shows another example of the kind of data obtainable from the apparatus of FIG. 3. In the example of FIG. 7, the hole patterns were written onto a SERODS disk in serial form using 100 kHz laser writing pulses.

Embodiment No. 3

Figure 8:
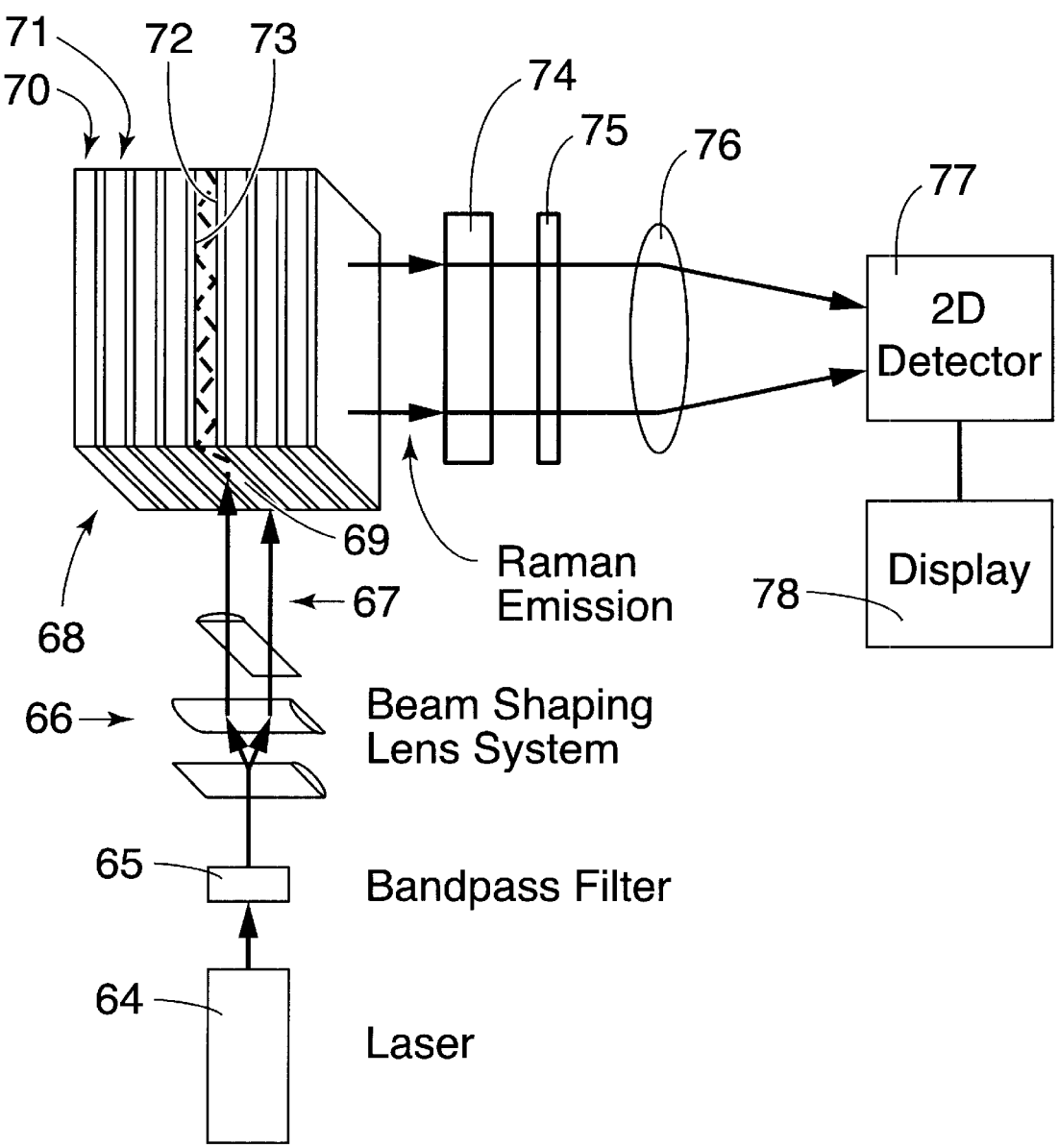
FIG. 8 illustrates a third embodiment of a SERODS system with parallel signal transfer that utilizes edge excitation of a 3-D SERODS medium.

In the embodiment of FIG. 8, the SERODS medium is a series of SERODS disks 70, 71 etc., that comprise a 3-D SERODS multi-layer stack 68. By exciting from the edge, one or a plurality of SERODS disks 70, 71 can be excited. This is an advance over the face excitation used in the earlier embodiments. If face excitation were used with the SERODS array of FIG. 8, all of the disks would be excited. The SERODS-PST system of this embodiment may use the evanescent excitation mode of different optically transparent substrates as illustrated in FIG. 8.

In FIG. 8, each optically transparent substrate may be coated with a specific chemical having characteristic Raman spectral peaks. Therefore, different substrates having different coating molecules may exhibit different SERS spectra. Simultaneous detection of these different optically transparent substrates can be performed accurately by using detectors tuned specifically to each optically transparent substrate with different optical filters. Each optical filter would be tuned to a specific SERS emission of the specific substrate layer, thus avoiding "cross-talk" between reading layers.

In the evanescent waveguide excitation approach, the beam from the laser 64 in FIG. 8 is passed through a bandpass filter 65, and collimated by a beam-shaping lens system 66 to form a planar beam 67. The beam-shaping lens system 66 can be a set of cylindrical lenses or a diffractive optics system. The planar beam 67 is focused onto an edge of an optically transparent substrate 69 of a selected one of the SERODS disks 70, 71, etc., in the SERODS array 68. With this edge excitation, the laser light undergoes multiple internal reflections within the two faces 72 and 73 of the selected SERODS disk. SERODS disks having coatings on both faces can be used in this embodiment since both faces of a disk are excited simultaneously by the evanescent radiation of the laser beam 67. After passing through a Raman holographic filter 74 to reject the Rayleigh scatter, an optional bandpass filter 75, and imaging optics 76, the two-dimensional image of the SERS signal is detected by the 2-D detector 77 and displayed by the display device 78. The detector 77 may be a charge-coupled device (CCD) or another comparable detector.

Embodiment No. 4

Figure 9:
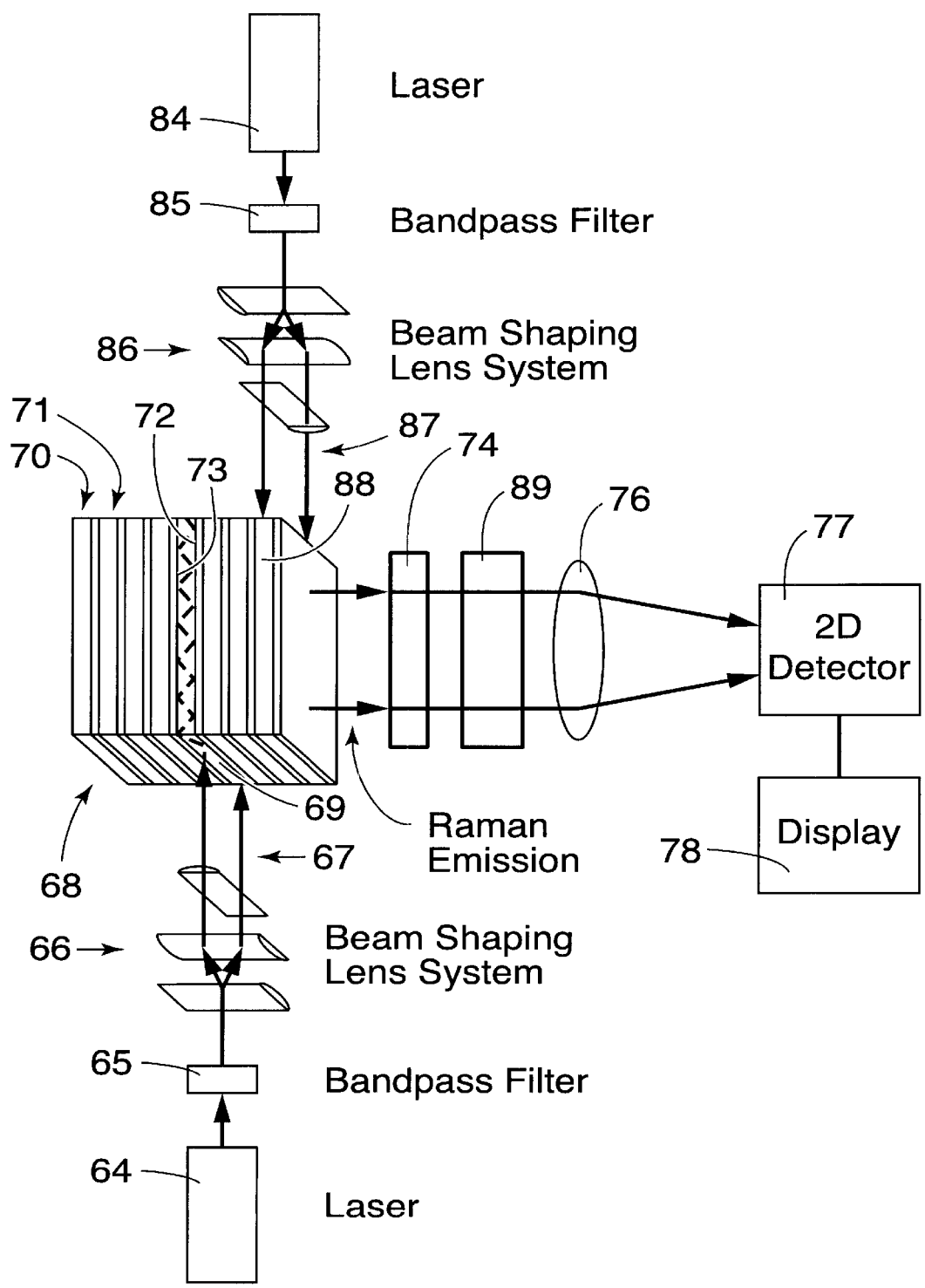
FIG. 9 illustrates a fourth embodiment of a SERODS system with parallel signal transfer that also utilizes edge excitation of a 3-D SERODS medium and employs more than one laser.

This embodiment extends the previous embodiment from one laser to more than one laser. In FIG. 9, the SERODS medium 68 is again depicted as a stack of SERODS disks 70, 71 etc. The evanescent excitation of different optically transparent substrates such as substrates 69 and 88 is illustrated in FIG. 9.

As in the previous embodiment, each optically transparent substrate 69, 88, etc., may be coated with a specific chemical having characteristic Raman spectral peaks. Simultaneous detection of these different optically transparent substrates can be performed accurately by using detectors tuned specifically to each optically transparent substrate with different optical filters, thus avoiding "cross-talk" between optically transparent substrates when they are read.

The evanescent waveguide excitation approach can also be used in this embodiment of the invention. In FIG. 9, a laser 64 is used to excite the optically transparent substrate 69 at one wavelength as in the previous embodiment. Another laser 84 is used to excite another optically transparent substrate 88 at a different wavelength. Each optically transparent substrate will have Raman emission peaks at different wavelengths. The two SERS emissions are filtered and recorded by selecting the two wavelengths separately. In the 2-D SERS light image signal path, a holographic notch filter 74 is used to reject the laser scatter, and an optional bandpass filter (not shown) may be used before the imaging optics 76. An acousto-optic tunable filter (AOTF) 89 is used to select and transmit the Raman signal. The acousto-optic tunable filter 89 is used instead of a conventional filter to select wavelengths for detection. The two-dimensional image of the SERS signal is displayed in the display device 78 after detection by the 2-D detector 77.

Embodiment No. 5a

Figure 10:
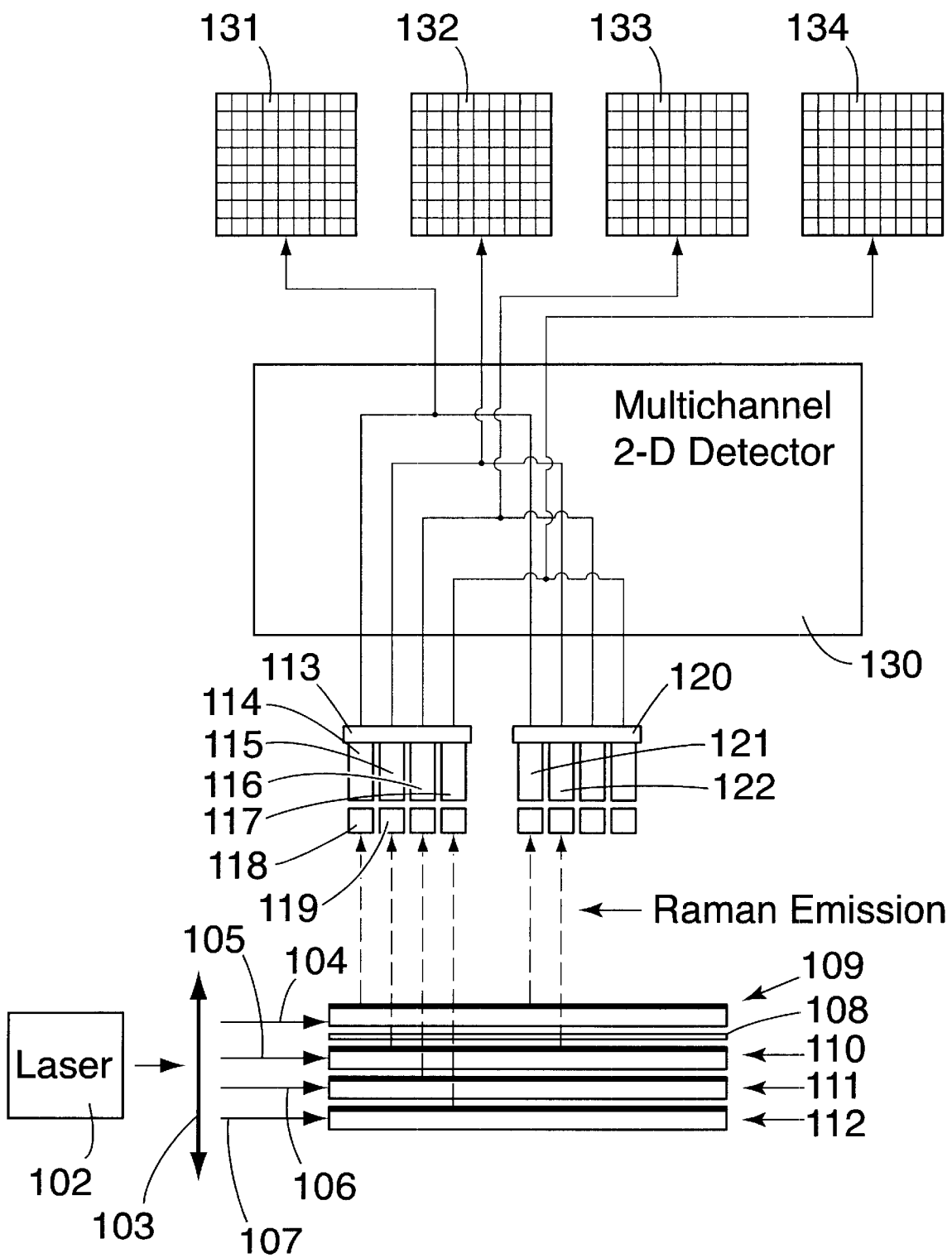
FIG. 10 illustrates a fifth embodiment of a SERODS system with parallel signal transfer that detects the Raman emission from different layers of a 3-D SERODS medium using different wavelengths simultaneously.

FIG. 10 shows another embodiment of the PST invention. In this embodiment, a multicolor-sensing CCD (or alternatively a 2-D detector with adjacent sensing pixels having different Raman filters) is used to detect the Raman emission from different layers on each SERODS disk using different wavelengths simultaneously. Different lasers emitting at different wavelengths may be used. Or, as shown in FIG. 10, the beam from a single laser 102 may be collimated by diffractive optics 103 to produce a beam array, i.e., multiple beams 104–107 that are input on the edges of multiple SERODS disks 109–112, respectively. If needed, wavelength blocking spacers such as spacer 108 can be used to separate the laser evanescent excitation in one SERODS disk 109 from that in another disk 110. Alternatively, an air space approximately 1 μm thick may function as a spacer. A 2-D detector 130 such as a CCD or a CID can be used to simultaneously detect the Raman signals from multiple SERODS optically transparent disks using different wavelengths. The embodiment shown in FIG. 10 illustrates four color detection.

In the example of FIG. 10, the 2D-detector 130 has sensing elements, or pixels, 113 that utilize four different color microsensors. The microsensors are each comprised of photosensors 114–117 and associated wavelength selectors 118, 119, etc. Photosensor 114 has an associated wavelength selector 118 in the form of a lens/filter system that detects Raman signals at a first wavelength from the SERODS disk 109. Similarly, photosensor 115 has an associated wavelength selector 119 that detects Raman signals at a second wavelength from the SERODS disk 110. The 2D-detector 130 processes the Raman signals at the same wavelengths separately. For example, it processes the Raman signals from photosensors 114, 121, etc., together, and the Raman signals from photosensors 115, 122, etc., together. In this manner, the 2-D detector 130 produces four different sets of 2-D data 131–134, each set containing data related to each SERODS disk 109–112, respectively.

Embodiment No. 5b

Figure 11:
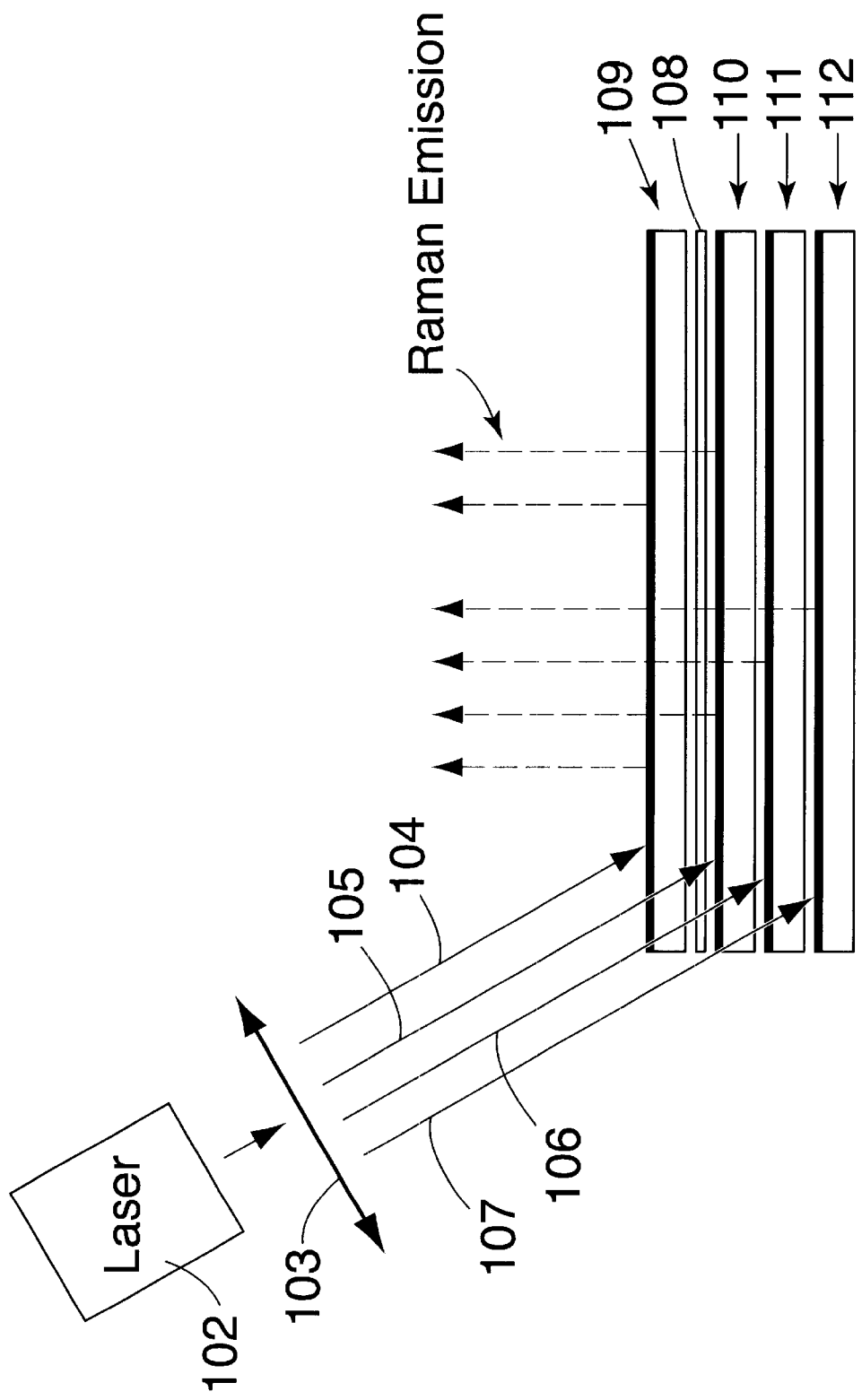
FIG. 11 illustrates a variation of the fifth embodiment of a SERODS system with parallel signal transfer utilizing a steeply-angled laser illumination.

FIG. 11 shows another embodiment of the invention that utilizes the system of the previous embodiment in a different geometrical arrangement. FIG. 11 shows the use of a steeply angled illumination by the laser 102 and lens system 103 of FIG. 10. In FIG. 11, the laser 102 and lens system 103 from FIG. 10 are positioned at an angle to cause the excitation of the front surfaces of the SERODS disk stack or plurality of SERS-active layers. In other words, front surface illumination, or face illumination, is made use of in this embodiment rather than the edge illumination of the embodiment of FIG. 10.

Embodiment No. 6

Figure 12:
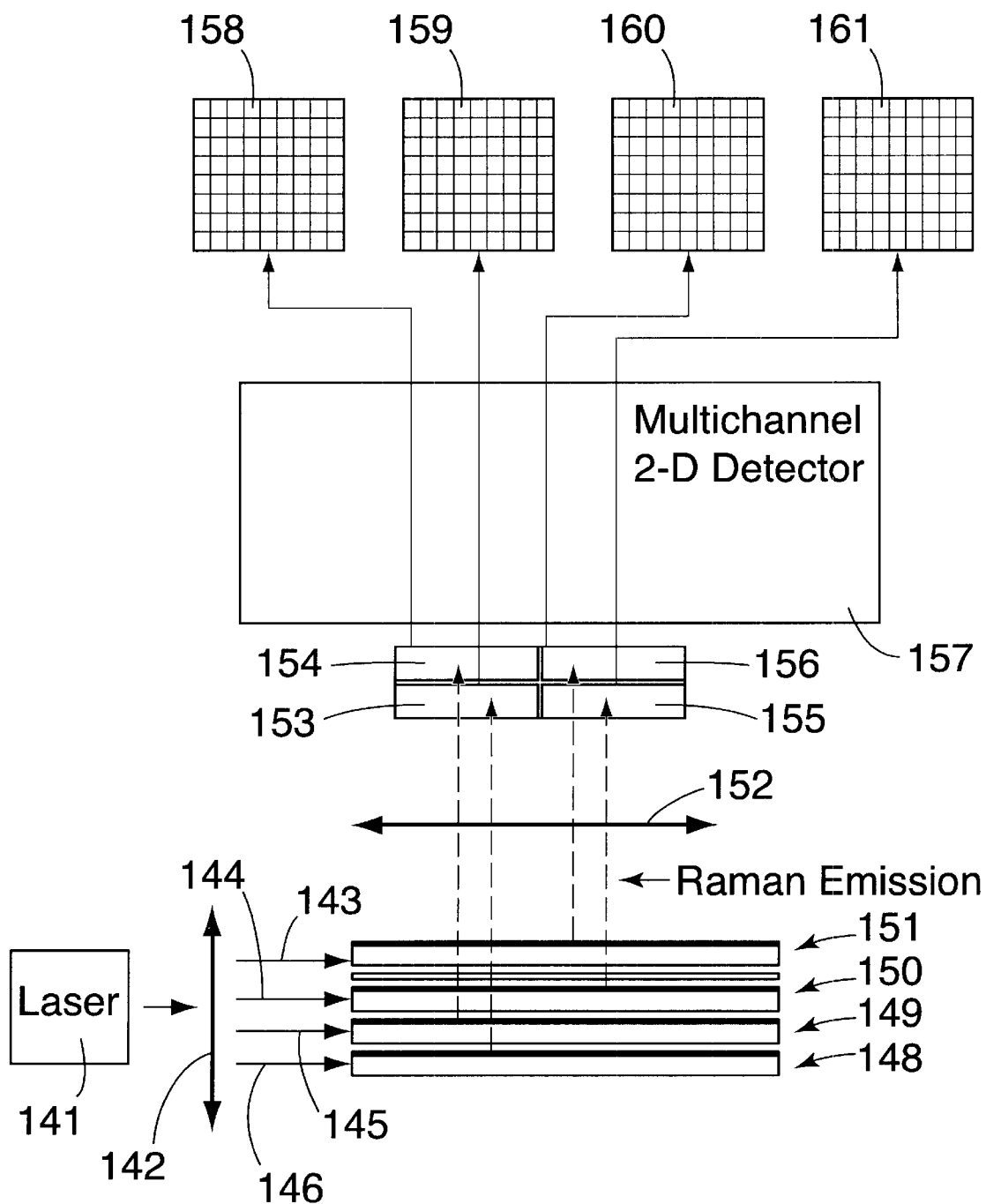
FIG. 12 illustrates a sixth embodiment of a SERODS system with parallel signal transfer that images the Raman emission from a plurality of SERODS disks onto specific detection sections of a 2-D detector.

FIG. 12 shows another alternative embodiment of the invention. Here, a diffractive lens system 152 images the Raman emission from each SERODS disk 148–151 onto a specific detection section of a 2-D detector 157 as in the embodiments of FIGS. 10 and 11. FIG. 12 shows a four-color system with each detection section or quadrant 153–156 representing one of the four colors. More particularly, the Raman emission from SERODS disk 148 is imaged onto the detection section 153 of the 2-D detector 157. The Raman emission from SERODS disk 149 is imaged onto the detection section 154 of the 2-D detector 157, etc. The sensing elements of each detection section 153–156 have a different filter that selects the wavelength of Raman emission of a specific disk 148–151. The multichannel 2-D detector 157 is designed to process the signal of each detection section individually, each detection section 153–156 collecting data related to a specific SERODS disk. In this example, four sets of output data 158–161 are produced that represent the Raman emission of the various SERODS disks 148–151. It is also possible to replace the 2-D detector 157 of FIG. 12 with four individual 2-D detectors, each detecting a different color Raman emission.

Embodiment No. 7

Figure 13:
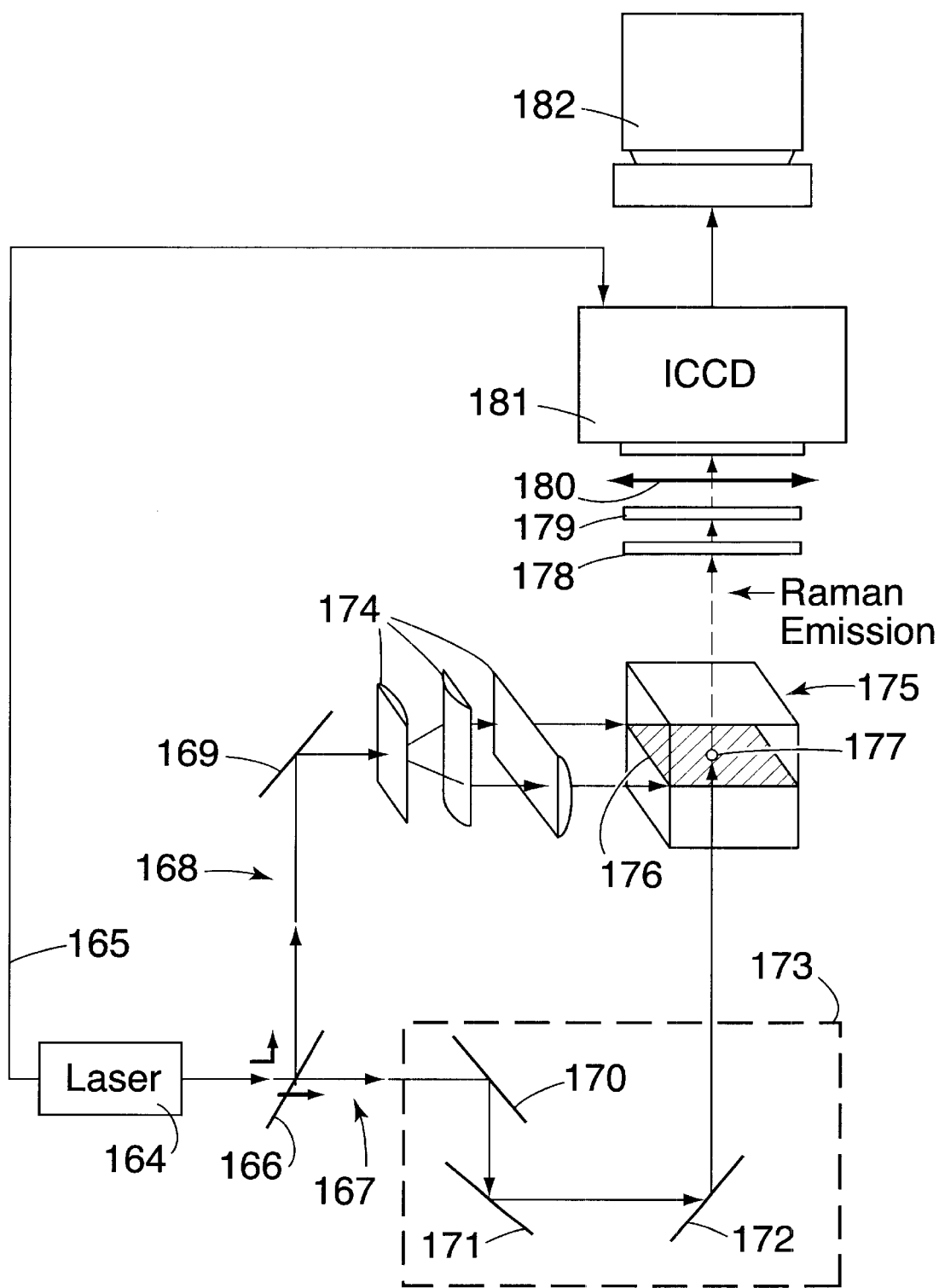
FIG. 13 illustrates a seventh embodiment of a SERODS system with parallel signal transfer that employs one laser, uses two wavelengths to excite a SERODS coating material, allows random data access, and is capable of both reading and writing SERODS data.

In a further embodiment of the invention, shown in FIG. 13, two wavelengths are used to excite an electronic absorption band of the chemical compound used as the SERODS coating material. By combining two wavelengths, a much different, i.e., more intense, resonance effect is realized within the SERODS medium. This resonance process is referred to as surface-enhanced resonance Raman scattering (SERRS), and the signal that is produced from the SERODS medium is much stronger (about $10^3$ enhancement) than the normal SERS signals that are produced using single wavelength excitation. Utilization of the SERRS effect allows random data access to also be achieved with this embodiment of the invention.

In FIG. 13, a single laser 164 is used to achieve the two wavelength surface-enhanced resonance Raman scattering (SERRS) effect in the SERODS material. In FIG. 13, the beam from laser 164 is split into two beams 167 and 168 by a dichroic mirror 166. The beam 168 is steered to the 3-D SERODS medium 175 by a system of cylindrical mirrors 174 that convert the beam 168 to a planar beam 176 that is passed through the SERODS medium 175. The other beam 167 is passed through an optical delay stage 173. The optical delay stage is a set of multiple dielectric mirrors 170–172 that can be translated in order to vary the light path length of the beam 167.

In this manner, both excitation beams, i.e., the planar beam 176 and the delayed beam 167 are made to strike a focal point 177 inside the 3-D SERODS medium 175 at the same time. In other words, the orthogonal beams 167, 176 are focused to the same point inside the SERODS medium by synchronizing the path length of the beams 167 and 168.

This crossed beam excitation allows the SERS-active molecules at the intersection of the two beams in the SERODS medium 175 to simultaneously absorb the energy of one photon from each beam, thereby providing an excitation equivalent to the sum of the two individual photons. The resulting optical SERS signal is passed through a holographic notch filter 178, band-pass filter 179, and optical system 180. The 2-D information from the SERODS medium 175 is then imaged onto a 2-D detector such as the intensified charge-coupled device (ICCD) 181 shown in FIG. 13. The ICCD 181 is triggered using the sync output 165 of the laser 164. The images that are collected in the 2-D detector 181 may then be downloaded to a computer 182 for further analysis if desired.

It is to be noted that the system shown in FIG. 13 may be used for writing SERS data as well as reading it. The configuration shown in FIG. 13 may be used for writing SERS data by either using a more intense laser 164 or by increasing the power of the laser 164 above a threshold in order to produce microspots or nanospots at the desired location inside the SERODS medium.

Embodiment No. 8

Figure 14:
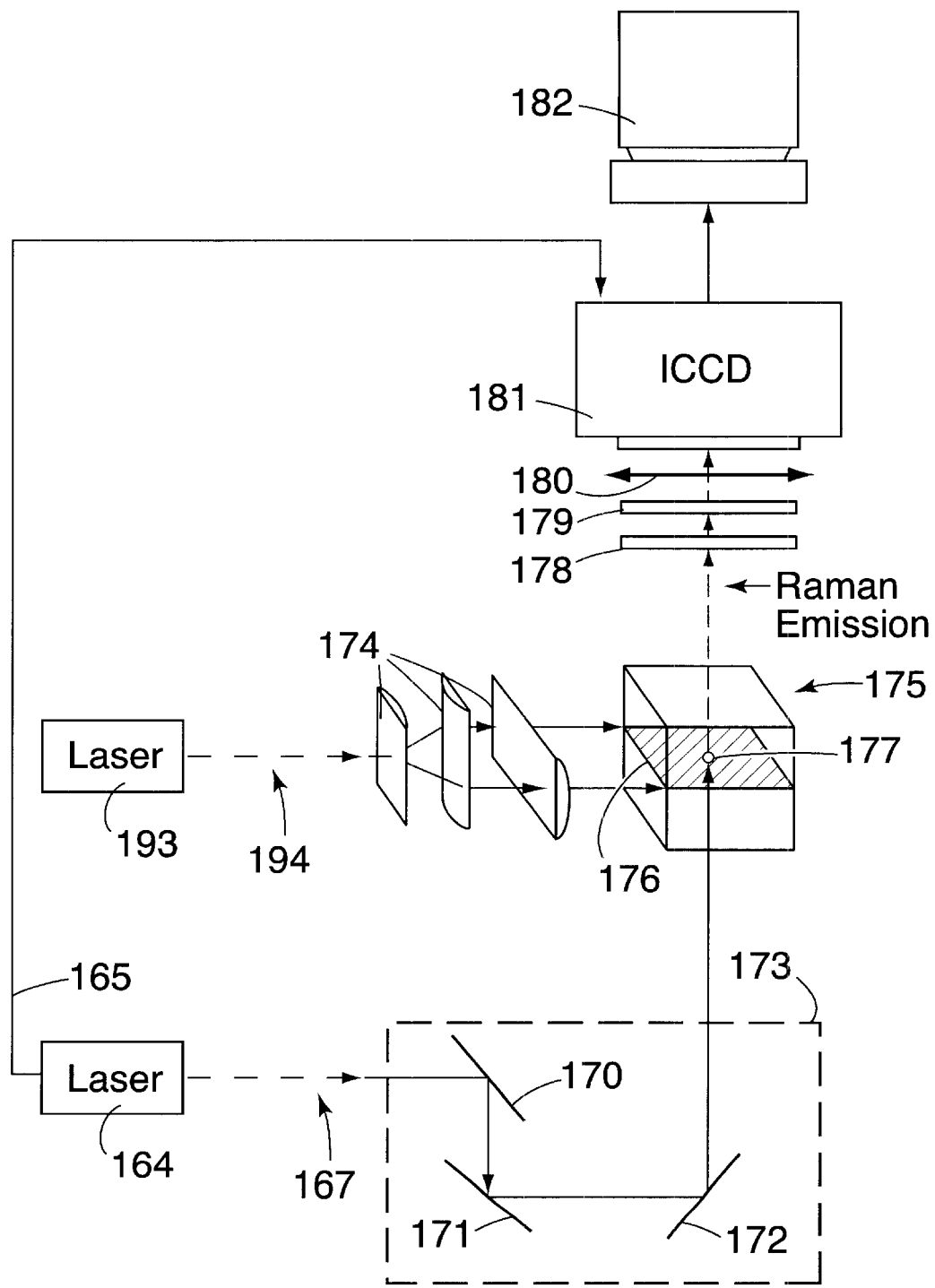
FIG. 14 illustrates an eighth embodiment of a SERODS system with parallel signal transfer that employs two lasers, uses two wavelengths to excite a SERODS coating material, allows random data access, and is capable of both reading and writing SERODS data.

FIG. 14 shows an embodiment similar to that of FIG. 13, except that a second laser 193 is used in conjunction with the laser 164. Except for the additional laser 193, the system of FIG. 14 is identical to that of FIG. 13 with regard to structure and function. Like the embodiment of FIG. 13, the embodiment of FIG. 14 has random access reading and writing capability since the laser beam 167 and planar laser beam 176 can be steered to any location in the 3-D SERODS medium 175.

Both embodiments also have both reading and writing capability. The writing and reading processes in both embodiments can use the same optical system. Only the laser intensity has to be different, i.e., the use a lower beam intensity for the reading process, and a higher beam intensity for the writing process in the embodiments of both FIG. 13 and FIG. 14.

In the embodiments of FIGS. 13 and 14, if the 3-D SERODS medium 175 is a stack of multiple SERODS disks or a layered 3-D SERODS medium instead of a single SERODS disk, the evanescent waveguide excitation feature can also be used. The evanescent waveguide excitation approach was described previously with respect to the embodiments of FIGS. 8 and 9. As described there, by causing the laser light to impinge on an edge of a SERODS layer or on an edge of one disk in a stack of disks, the laser light undergoes multiple internal reflections between the two faces of the selected SERODS disk layer.

Embodiment No. 9

Figure 15:
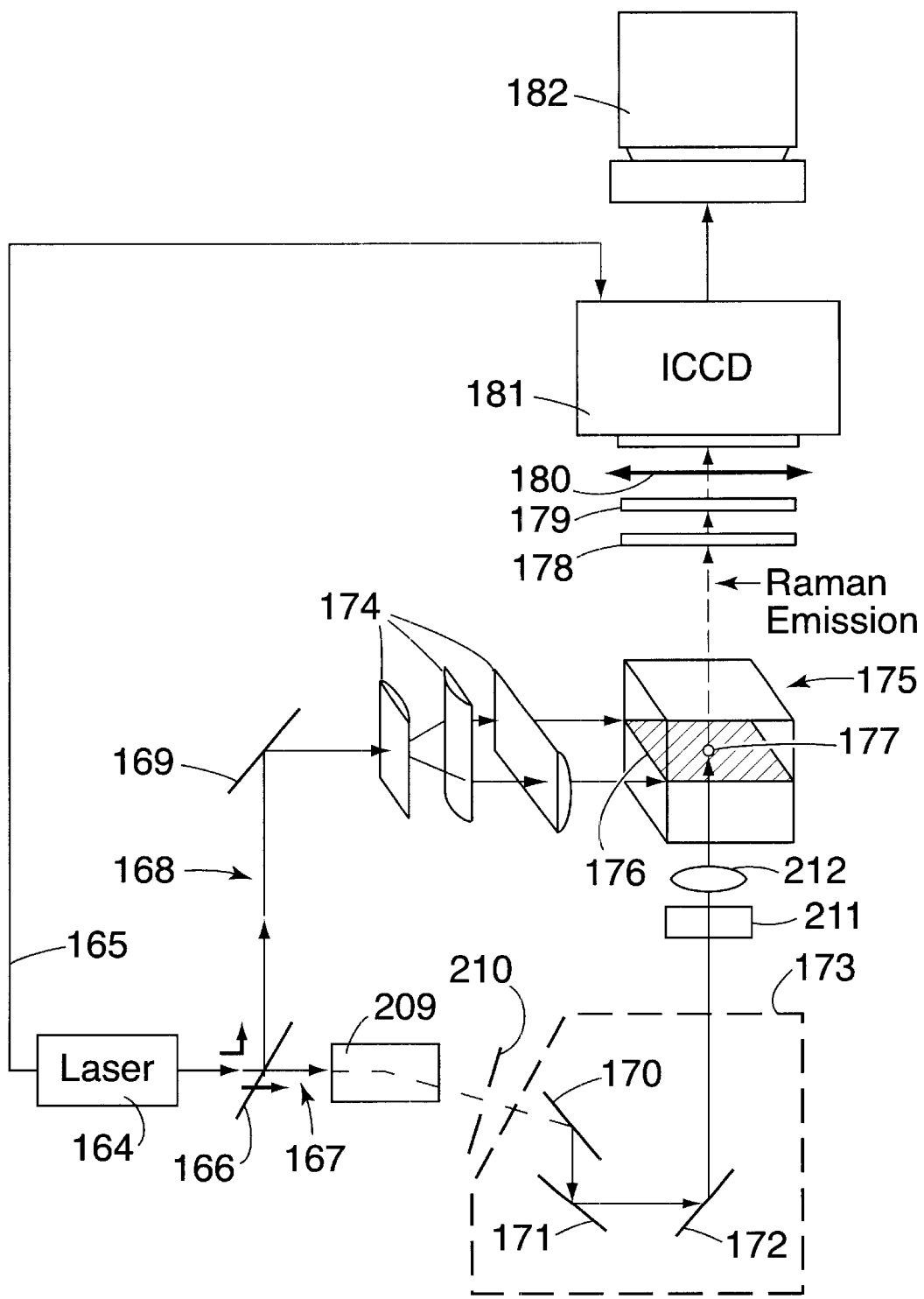
FIG. 15 illustrates a ninth embodiment of a SERODS system with parallel signal transfer that is based on adding an acousto-optic (A-O) modulator to the one laser system shown in FIG. 13.

FIG. 15 shows another embodiment of the invention that can be used for reading and writing a 3-D surface-enhanced Raman optical data storage (SERODS) media. It is based on adding an acousto-optic (A-O) modulator 209 to the system shown in FIG. 13. In FIG. 15, the A-O modulator 209 is used to deflect the read or write laser beam towards the SERODS medium 175 at very high speeds and high frequencies of from 100 kHz to 40 MHz. When used in the read mode, the embodiment of FIG. 15 functions the same as the embodiment of FIG. 13. The light beam 167 from the laser 164 is passed through the A-O modulator 209 without being affected by the A-O modulator.

In the embodiment of FIG. 15, the write beam source 164 is an argon ion laser operated in the single line mode at 488 nm. With this system, laser powers of up to 500 mW can be used. An A-O modulator such as the Model N35210, available from Newport Electro Optics Systems, Inc., Melbourne, Fla., can be used. The rise time for this modulator is 15 ns. A function generator in the A-O modulator 209 determines the frequency of modulation.

The A-O modulator 209 allows control of pulse shapes, with rise times ranging from 0.05 to 2 $\mu$s, and pulse widths ranging from 0.3 $\mu$s to 100 $\mu$s. For higher frequencies of modulation, a 40-MHz sine wave generator can be used.

In FIG. 15, the A-O modulator 209 can be housed in a Newport Model N71002 focusing optics assembly for accurate positioning of the A-O modulator in the laser beam 167. A slit 210 is used with the A-O modulator 209 to select the modulated, deflected beam, which can have intensities of up to 250 mW for a 500 mW. input beam. All the necessary beam-directing mirrors 169 and 170–172 are planar. A spatial filter/beam expansion assembly 211 can be used for encoding submicron-sized holes in the SERODS medium 175. The laser beam 167 is focused onto the SERODS medium using the focusing optics 212. The SERODS medium 175 can either be spun, translated, or both.

Two inchworm-type drive stages (not shown) can be used to produce translational motion of the SERODS medium 175 in the X and Y directions. These stages operate with an encoded resolution of 0.1 $\mu$m and with speeds of up to approximately 4000 $\mu$m/s. The spinning unit for the SERODS medium 175 is presently a CD player. The translational stage control unit (not shown) is presently interfaced with a computer, and can be interfaced with the A-O modulator 209 for more fully coordinated writing control.

Embodiment No. 10

Figure 16:
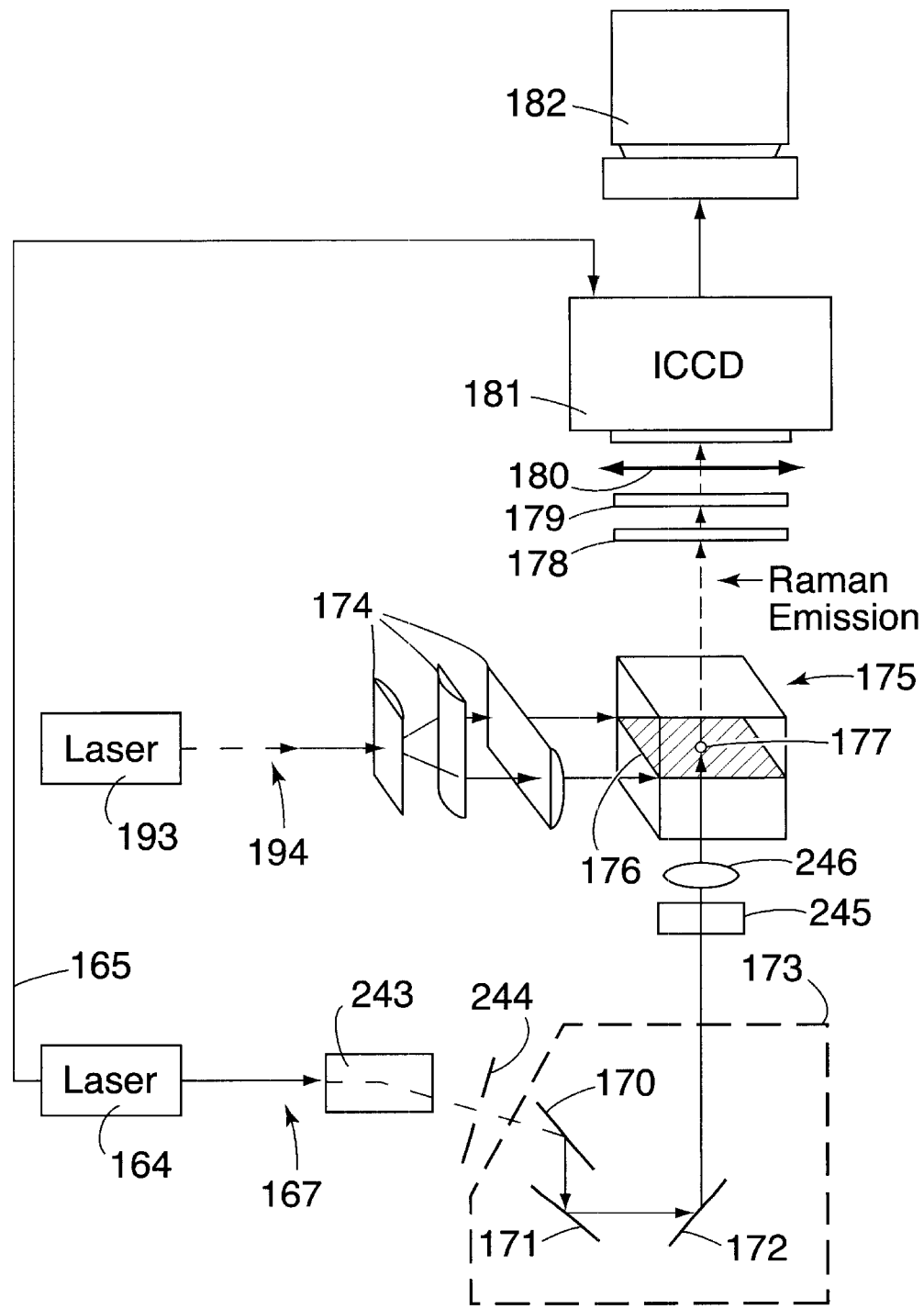
FIG. 16 illustrates a tenth embodiment of a SERODS system with parallel signal transfer that is based on adding an acousto-optic (A-O) modulator to the two laser system shown in FIG. 14.

FIG. 16 shows another embodiment of the invention that can be used for reading and writing a 3-D surface-enhanced Raman optical data storage (SERODS) media. It is based on adding an acousto-optic (A-O) modulator 243 to the system shown in FIG. 14. In FIG. 16, the A-O modulator 243 is used to deflect the read or write laser beam towards the SERODS medium 175 at very high speeds and high frequencies of from 100 kHz to 40 MHz. When used in the read mode, the embodiment of FIG. 16 is the same as the embodiment of FIG. 14. The light beam 167 from the laser 164 is passed through the A-O modulator 243 without being affected by the A-O modulator.

In the embodiment of FIG. 16, the write beam source 164 is an argon ion laser operated in the single line mode at 488 nm. With this system, laser powers of up to 500 mW can be used. An A-O modulator such as the Model N35210, available from Newport Electro Optics Systems, Inc., Melbourne, Fla., can be used. The rise time for this modulator is 15 ns. A function generator in the A-O modulator 243 determines the frequency of modulation.

The A-O modulator 243 allows control of pulse shapes, with rise times ranging from 0.05 to 2 $\mu$s, and pulse widths ranging from 0.3 $\mu$s to 100 $\mu$s. For higher frequencies of modulation, a 40-MHz sine wave generator can be used.

In FIG. 16, the A-O modulator 243 can be housed in a Newport Model N71002 focusing optics assembly for accurate positioning of the A-O modulator in the laser beam 167. A slit 244 is used with the A-O modulator 243 to select the modulated, deflected beam, which can have intensities of up to 250 mW for a 500 mW input beam. All the necessary beam-directing mirrors 170–172 are planar. A spatial filter/beam expansion assembly 245 can be used for encoding submicron-sized holes in the SERODS medium 175. The laser beam 167 is focused onto the SERODS medium using the focusing optics 246. The SERODS medium 175 can be either spun, translated, or both.

Two inchworm-type drive stages (not shown) can be used to produce translational motion of the SERODS medium 175 in the X and Y directions. These stages operate with an encoded resolution of 0.1 $\mu$m and with speeds of up to approximately 4000 $\mu$m/s. The spinning unit for the SERODS medium 175 is presently a CD player. The translational stage control unit (not shown) is presently interfaced with a computer, and can be interfaced with the A-O modulator 243 for more fully coordinated writing control.

It can be noted that the parallel signal transfer (PST) systems described herein allow the use of long integration times (msec to seconds) to record the SERS signals, and that large amounts of data can be read and transferred simultaneously. Long signal integration times are especially important for SERODS systems since they can substantially improve the signal-to-noise ratio of the SERS signals. With the conventional sequential scanning approach, the reading time, which determines the reading speed, must be short (nsec to $\mu$sec). The PST method thus uses to advantage the multichannel capability of the reading process.

Since the reading is based on an emission process (i.e., zero background), the SERODS detection is not detector noise limited, and can have a high "reading" sensitivity. A unique feature of SERODS systems is the instantaneous nature of the Raman scattering process. Unlike other emission types which have an emission lifetime that determines the limiting speed of the reading process, SERODS systems have no limiting reading speed. The sensitivity of the detector determines the reading speed.

The data transfer rate can be estimated by considering the following examples. When a complete disk of 1 Mbits can be read by a CCD in 0.1 sec. a reading/transfer rate of 10 mbit/s can be achieved. However, if the detector (e.g., an intensified CCD) can read the data disk in 10 msec, the resulting transfer rate is 100 Mbit/s. With 10 layers being read simultaneously, the resulting data transfer rate is 1 Gigabit/sec. Large-panel CCD devices will also increase the data disk size to be transferred. The herein described embodiments and results thus demonstrate the potential of the SERODS-PST system to achieve ultra-rapid Gigabit/sec reading rates.

While there has been shown and described what are at present considered the preferred embodiments of the invention, it will be obvious to those skilled in the art that various changes and modifications can be prepared therein without departing from the scope of the inventions defined by the appended claims.

I claim:

1. A parallel signal transfer system (PSTS) for reading a surface-enhanced Raman optical data storage (SERODS) medium comprising:

a laser providing an optical light beam to the SERODS medium, said laser adapted to produce a two-dimensional surface-enhanced Raman scattering (SERS) optical light image signal from the SERODS medium;

a two-dimensional detector receiving the 2-D SERS optical light image signal, said two-dimensional detector adapted for producing a 2-D image of the 2-D SERS optical light image signal;

a holographic notch filter positioned between the SERODS medium and said two-dimensional detector, said holographic notch filter rejecting the Raleigh scatter from the two-dimensional SERS optical light image signal; and imaging optics positioned at the entrance to said two-dimensional detector, said imaging optics adapted to focus the two-dimensional SERS optical light image signal onto said two-dimensional detector.

2. The PSTS of claim 1, further comprising focusing optics and an optical fiber, said focusing optics and said optical fiber positioned between said laser and said SERODS medium, said focusing optics adapted to focus the beam of said laser into said optical fiber.

3. The PSTS of claim 2, further comprising a bandpass filter positioned between said optical fiber and said SERODS medium, said bandpass filter adapted to reject the Raman scattering of the optical fiber.

4. The PSTS of claim 1, wherein said SERODS medium is a 2-D SERODS disk.

5. The PSTS of claim 1, wherein said SERODS medium is a stack of SERODS disks.

6. The PSTS of claim 1, wherein said SERODS medium is a three-dimensional SERODS medium.

7. The PSTS of claim 1, wherein said imaging optics is GRIN lens array.

8. The PSTS of claim 1, wherein said imaging optics is a diffractive optics lens arrangement.

9. The PSTS of claim 1, further comprising a bandpass filter, said bandpass filter positioned between said imaging optics and said 2-D detector.

10. The PSTS of claim 1, further comprising a tunable filter, said tunable filter positioned between said imaging optics and said 2-D detector.

11. The PSTS of claim 1, wherein said 2-D detector is a charge coupled device camera.

12. The PSTS of claim 1, wherein said 2-D detector is a charge injection device.

13. The PSTS of claim 1, wherein said 2-D detector is a CMOS detector.

14. The PSTS of claim 13, wherein said CMOS detector is a photodiode array.

15. A parallel signal transfer system (PSTS) for reading a surface-enhanced Raman optical data storage (SERODS) medium comprising:

a microreader system adapted for placement of the SERODS medium therein;

a laser providing an optical light beam to the SERODS medium in said microreader system, said laser adapted to produce a two-dimensional surface-enhanced Raman scattering (SERS) optical light image signal from the SERODS medium;

a combined spatial filter and beam expansion module positioned between said laser and said microreader system, said combined spatial filter and beam expansion module adapted to expand and re-collimate the optical light beam from said laser;

a two-dimensional detector receiving the 2-D SERS optical light image signal from said microreader system, said two-dimensional detector adapted for producing a 2-D image of the 2-D SERS optical light image signal;

an optical lens system positioned between said microreader system and said 2-D detector for projecting the 2-D SERS optical light image signal onto said 2-D detector; and a holographic notch filter positioned between said optical lens system and said 2-D detector, said holographic notch filter rejecting the Raleigh scatter from the two-dimensional SERS optical light image signal.

16. The PSTS of claim 15, further comprising focusing optics and an optical fiber, said focusing optics and said optical fiber positioned between said laser and said microreader system, said focusing optics adapted to focus the beam of said laser into said optical fiber.

17. The PSTS of claim 16, further comprising a bandpass filter positioned between said optical fiber and said combined spatial filter and beam expansion module, said bandpass filter adapted to reject the Raman scattering of the optical fiber.

18. The PSTS of claim 15, wherein said SERODS medium is a 2-D SERODS disk.

19. The PSTS of claim 15, wherein said SERODS medium is a stack of SERODS disks.

20. The PSTS of claim 15, wherein said SERODS medium is a three-dimensional SERODS medium.

21. The PSTS of claim 15, further comprising a bandpass filter, said bandpass filter positioned in the 2-D SERS optical light image signal path before said 2-D detector.

22. The PSTS of claim 15, further comprising a tunable filter, said tunable filter positioned in the 2-D SERS optical light image signal path before said 2-D detector.

23. The PSTS of claim 15, wherein said 2-D detector is a charge coupled device camera.

24. The PSTS of claim 15, wherein said 2-D detector is a charge injection device.

25. The PSTS of claim 15, wherein said 2-D detector is a CMOS detector.

26. The PSTS of claim 25, wherein said CMOS detector is a photodiode array.

27. The PSTS of claim 15 additionally comprising:

a holographic notch filter receiving the 2-D SERS optical light image signal along a second light path from said microreader system, said holographic notch filter rejecting the Raleigh scatter from the second path two-dimensional SERS optical light image signal;

a spectrograph adapted for producing a 2-D SERS spectra of the second path two-dimensional SERS optical light image signal; and a two-dimensional detector receiving the 2-D SERS spectra from said spectrograph, said two-dimensional detector adapted for producing a 2-D image of the 2-D SERS spectra.

28. The PSTS of claim 27, further comprising focusing optics and an optical fiber, said focusing optics and said optical fiber positioned between said holographic notch filter and said spectrograph, said focusing optics adapted to focus the second path two-dimensional SERS optical light image signal into said spectrograph.

29. The PSTS of claim 28, wherein said 2-D detector is an intensified charge-coupled device.

30. A parallel signal transfer system (PSTS) for reading a surface-enhanced Raman optical data storage (SERODS) medium comprising:

a laser providing an optical light beam to the SERODS medium, said laser adapted to produce a two-dimensional surface-enhanced Raman scattering (SERS) optical light image signal from the SERODS medium;

a beam shaping lens system positioned in said optical light beam, said beam shaping lens system adapted to produce evanescent wave excitation in the SERODS medium;

a two-dimensional detector receiving the 2-D SERS optical light image signal, said two-dimensional detector adapted for producing a 2-D image the 2-D SERS optical light image signal;

a holographic notch filter positioned between the SERODS medium and said two-dimensional detector, said holographic notch filter rejecting the Raleigh scatter from the two-dimensional SERS optical light image signal; and imaging optics positioned at the entrance to said two-dimensional detector, said imaging optics adapted to focus the two-dimensional SERS optical light image signal onto said two-dimensional detector.

31. The PSTS of claim 30, further comprising focusing optics and an optical fiber, said focusing optics and said optical fiber positioned between said laser and said beam shaping lens system, said focusing optics adapted to focus the beam of said laser into said optical fiber.

32. The PSTS of claim 31, further comprising a bandpass filter positioned between said optical fiber and said beam shaping lens system, said bandpass filter adapted to reject the Raman scattering of the optical fiber.

33. The PSTS of claim 30, wherein said beam shaping lens system is a cylindrical lens system.

34. The PSTS of claim 30, wherein said beam shaping lens system is a diffractive optics system.

35. The PSTS of claim 30, wherein said SERODS medium is a 2-D SERODS disk, and wherein said optical light beam is arranged to impinge on an edge of said 2-D SERODS disk.

36. The PSTS of claim 30, wherein said SERODS medium is a stack of 2-D SERODS disks, and wherein the optical light beam is arranged to impinge on an edge of at least one SERODS disk in said stack of 2-D SERODS disks.

37. The PSTS of claim 30, wherein said SERODS medium is a three-dimensional SERODS medium containing a plurality of SERS-active layers, and wherein the optical light beam is arranged to impinge on an edge of at least one of said SERS-active layers.

38. The PSTS of claim 30, further comprising a bandpass filter, said bandpass filter positioned in the 2-D SERS optical light image signal path before said imaging optics.

39. The PSTS of claim 30, wherein said imaging optics is a GRIN lens array.

40. The PSTS of claim 30, wherein said imaging optics is a diffractive optics system.

41. The PSTS of claim 30, wherein said 2-D detector is a charge coupled device camera.

42. The PSTS of claim 30, wherein said 2-D detector is a charge injection device.

43. The PSTS of claim 30, wherein said 2-D detector is a CMOS detector.

44. The PSTS of claim 43, wherein said CMOS detector is a photodiode array.

45. A parallel signal transfer system (PSTS) for reading a surface-enhanced Raman optical data storage (SERODS) medium comprising:
- a laser providing an optical light beam to the SERODS medium, said laser adapted to produce a two-dimensional surface-enhanced Raman scattering (SERS) optical light image signal from the SERODS medium;
- a beam shaping lens system positioned in the optical light beam, said beam shaping lens system adapted to produce evanescent wave excitation in the SERODS medium;
- a two-dimensional detector receiving the 2-D SERS optical light image signal, said two-dimensional detector adapted for producing a 2-D image the 2-D SERS optical light image signal;
- a holographic notch filter positioned between the SERODS medium and said two-dimensional detector, said holographic notch filter rejecting the Raleigh scatter from the two-dimensional SERS optical light image signal;
- imaging optics positioned at the entrance to said two-dimensional detector, said imaging optics adapted to focus the two-dimensional SERS optical light image signal onto said two-dimensional detector;
- a second laser providing a second optical light beam to the SERODS medium, said second laser adapted to produce a second two-dimensional surface-enhanced Raman scattering (SERS) optical light image signal from the SERODS medium; and
- a second beam shaping lens system positioned in the second optical light beam, said second beam shaping lens system adapted to produce evanescent wave excitation in the SERODS medium.

46. The PSTS of claim 45, further comprising focusing optics and an optical fiber, said focusing optics and said optical fiber positioned between said laser and said beam shaping lens system, said focusing optics adapted to focus the beam of said laser into said optical fiber.

47. The PSTS of claim 46, further comprising a bandpass filter positioned between said optical fiber and said beam shaping lens system, said bandpass filter adapted to reject the Raman scattering of the optical fiber.

48. The PSTS of claim 45, wherein said beam shaping lens system is a cylindrical lens system.

49. The PSTS of claim 45, wherein said beam shaping lens system is a diffractive optics system.

50. The PSTS of claim 45, wherein said SERODS medium is a 2-D SERODS disk, and wherein the optical light beam is arranged to impinge on an edge of said 2-D SERODS disk.

51. The PSTS of claim 45, wherein said SERODS medium is a stack of 2-D SERODS disk's, and wherein the optical light beam is arranged to impinge on an edge of at least one SERODS disk in said stack of 2-D SERODS disks.

52. The PSTS of claim 45, wherein said SERODS medium is a three-dimensional SERODS medium containing a plurality of SERS-active layers, and wherein the optical light beam is arranged to impinge on an edge of at least one of said SERS-active layers.

53. The PSTS of claim 45, further comprising a bandpass filter, said bandpass filter positioned in the 2-D SERS optical light image signal path before said imaging optics.

54. The PSTS of claim 45, wherein said imaging optics is a GRIN lens array.

55. The PSTS of claim 45, wherein said imaging optics is a diffractive optics system.

56. The PSTS of claim 45, wherein said 2-D detector is a charge coupled device camera.

57. The PSTS of claim 45, wherein said 2-D detector is a charge injection device.

58. The PSTS of claim 45, wherein said 2-D detector is a CMOS detector.

59. The PSTS of claim 58, wherein said CMOS detector is a photodiode array.

60. The PSTS of claim 45, wherein said second beam shaping lens system is a cylindrical lens system.

61. The PSTS of claim 45, wherein said second beam shaping lens system is a diffractive optics system.

62. A parallel signal transfer system (PSTS) for reading a three dimensional surface-enhanced Raman optical data storage (SERODS) medium comprising:
- a laser providing multiple optical light beams to the SERODS medium, said laser adapted to produce multiple two-dimensional surface-enhanced Raman scattering (SERS) optical light image signals from the SERODS medium;
- diffraction optics positioned in the optical light beam, said diffraction optics adapted to produce multiple optical light beams that produce multiple evanescent wave excitations in the SERODS medium from edge illumination of the SERODS medium; and
- a two-dimensional detector receiving the multiple 2-D SERS optical light image signals, said 2-D detector having multiple wavelength sensing elements, each sensing element comprising a plurality of microsensors adapted for detecting at a specific wavelength, said 2-D detector adapted for processing the signals from said plurality of microsensors to produce multiple 2-D images of the 2-D SERS optical light image signals.

63. The PSTS of claim 62, further comprising focusing optics and an optical fiber, said focusing optics and said optical fiber positioned between said laser and said diffraction optics, said focusing optics adapted to focus the beam of said laser into said optical fiber.

64. The PSTS of claim 62, wherein said SERODS medium is a plurality of adjacent stacked SERODS disks.

65. The PSTS of claim 62, wherein said SERODS medium is 3-D SERODS medium containing a plurality of SERS-active layers.

66. The PSTS of claim 62, further comprising a bandpass filter, said bandpass filter positioned in the multiple two-dimensional surface-enhanced Raman scattering (SERS) optical light image signals path from the SERODS medium.

67. The PSTS of claim 62, further comprising a tunable filter, said tunable filter positioned in the multiple two-dimensional surface-enhanced Raman scattering (SERS) optical light image signals path before said 2-D detector.

68. The PSTS of claim 62, wherein each of said microsensors comprises a Photosensor and an associated wavelength selector.

69. A parallel signal transfer system (PSTS) for reading a three dimensional surface-enhanced Raman optical data storage (SERODS) medium comprising:
- a laser providing multiple optical light beams to the SERODS medium, said laser adapted to produce multiple two-dimensional surface-enhanced Raman scattering (SERS) optical light image signals from the SERODS medium;
- diffraction optics positioned in the optical light beam, said diffraction optics adapted to produce multiple optical light beams that produce multiple evanescent wave excitations in the SERODS medium from face illumination of the SERODS medium; and a two-dimensional detector receiving the multiple 2-D SERS optical light image signals, said 2-D detector having multiple wavelength sensing elements, each sensing element comprising a plurality of microsensors adapted for detecting at a specific wavelength, said 2-D detector adapted for processing the signals from said plurality of microsensors to produce multiple 2-D images of the 2-D SERS optical light image signals.

70. The PSTS of claim 69, further comprising focusing optics and an optical fiber, said focusing optics and said optical fiber positioned between said laser and said diffraction optics, said focusing optics adapted to focus the beam of said laser into the optical fiber.

71. The PSTS of claim 69, wherein said SERODS medium is a plurality of adjacent stacked SERODS disks.

72. The PSTS of claim 69, wherein said SERODS medium is a 3-D SERODS medium containing a plurality of SERS-active layers.

73. The PSTS of claim 69, further comprising a bandpass filter, said bandpass filter positioned in the multiple two-dimensional surface-enhanced Raman scattering (SERS) optical light image signals path from the SERODS medium.

74. The PSTS of claim 69, further comprising a tunable filter, said tunable filter positioned in the multiple two-dimensional surface-enhanced Raman scattering (SERS) optical light image signals path before said 2-D detector.

75. The PSTS of claim 69, wherein each of said microsensors comprises a photosensor and an associated wavelength selector.

76. A parallel signal transfer system (PSTS) for reading a three dimensional surface-enhanced Raman optical data storage (SERODS) medium comprising:
    a laser providing multiple optical light beams to the SERODS medium, said laser adapted to produce multiple two-dimensional surface-enhanced Raman scattering (SERS) optical light image signals from the SERODS medium;
    diffraction optics positioned in the optical light beam, said diffraction optics adapted to produce multiple optical light beams that produce multiple evanescent wave excitations in the SERODS medium from edge illumination of the SERODS medium; and
    a two-dimensional detector receiving the multiple 2-D SERS optical light image signals, said 2-D detector having multiple sections of sensing elements, each section having wavelength selective elements for detecting at a specific wavelength, said 2-D detector adapted for processing the signals from said detection sections to produce multiple 2-D images of the 2-D SERS optical light image signals.

77. The PSTS of claim 76, further comprising focusing optics and an optical fiber, said focusing optics and said optical fiber positioned between said laser and said diffrative lens system, said focusing optics adapted to focus the beam of said laser into the optical fiber.

78. The PSTS of claim 76, wherein said SERODS medium is a plurality of adjacent stacked SERODS disks.

79. The PSTS of claim 76, wherein said SERODS medium is 3-D SERODS medium containing a plurality of SERS-active layers.

80. The PSTS of claim 76, further comprising a bandpass filter, said bandpass filter positioned in the multiple two-dimensional surface-enhanced Raman scattering (SERS) optical light image signals path from the SERODS medium.

81. The PSTS of claim 76, further comprising a tunable filter, said tunable filter positioned in the multiple two-dimensional surface-enhanced Raman scattering (SERS) optical light image signals path before said 2-D detector.

82. A parallel signal transfer system (PSTS) for reading a surface-enhanced Raman optical data storage (SERODS) medium comprising:
    a pulsed laser providing optical light pulses to the SERODS medium, said laser adapted to produce a two-dimensional surface-enhanced Raman scattering (SERS) optical light image signal from the SERODS medium;
    a beam splitter for splitting the optical light pulses into first and second pulsed beams;
    a cylindrical mirror system positioned in the first pulsed beam path, said cylindrical mirror system adapted for spreading the first pulsed beam into a 2-D excitation plane;
    an optical delay positioned in the second pulsed beam path, said optical delay adapted for producing pulse overlap with the first pulsed beam for two-photon excitation in the SERODS medium;
    a two-dimensional detector receiving the two-dimensional SERS optical light image signal, said two-dimensional detector adapted for producing a 2-D image of the 2-D SERS optical light image signal; and
    a holographic notch filter positioned between the SERODS medium and said two-dimensional detector, said holographic notch filter rejecting the Raleigh scatter from the two-dimensional SERS optical light image signal.

83. The PSTS of claim 82, further comprising a bandpass filter, said bandpass filter positioned in the two-dimensional SERS optical light image signal path from the SERODS medium.

84. The PSTS of claim 82, further comprising a tunable filter, said tunable filter positioned in the two-dimensional SERS optical light image signal path before said 2-D detector.

85. The PSTS of claim 82, wherein said 2-D detector is a charge coupled device camera.

86. The PSTS of claim 82, wherein said 2-D detector is a charge injection device.

87. The PSTS of claim 82, wherein said 2-D detector is a CMOS detector.

88. The PSTS of claim 87, wherein said CMOS detector is a photodiode array.

89. A parallel signal transfer system (PSTS) for reading a surface-enhanced Raman optical data storage (SERODS) medium comprising:
    a first pulsed laser providing a first pulsed optical light beam to the SERODS medium, said laser adapted to produce a two-dimensional surface-enhanced Raman scattering (SERS) optical light image signal from the SERODS medium;
    a cylindrical mirror system positioned in the first pulsed optical light beam path, said cylindrical mirror system adapted for spreading the first pulsed beam into a 2-D excitation plane;
    a second pulsed laser providing a second pulsed optical light beam to the SERODS medium, said laser adapted to produce a two-dimensional surface-enhanced Raman scattering (SERS) optical light image signal from the SERODS medium;
    an optical delay positioned in the second pulsed beam path, said optical delay adapted for producing pulse overlap with the first pulsed beam for two-photon excitation in the SERODS medium;

a two-dimensional detector receiving the two-dimensional SERS optical light image signal, said two-dimensional detector adapted for producing a 2-D image of the 2-D SERS optical light image signal; and a holographic notch filter positioned between the SERODS medium and said two-dimensional detector, said holographic notch filter rejecting the Raleigh scatter from the two-dimensional SERS optical light image signal.

90. The PSTS of claim 89, further comprising a bandpass filter, said bandpass filter positioned in the two-dimensional SERS optical light image signal path from the SERODS medium.

91. The PSTS of claim 89, further comprising a tunable filter, said tunable filter positioned in the two-dimensional SERS optical light image signal path before said 2-D detector.

92. The PSTS of claim 89, wherein said 2-D detector is a charge coupled device camera.

93. The PSTS of claim 89, wherein said 2-D detector is a charge injection device.

94. The PSTS of claim 89, wherein said 2-D detector is a CMOS detector.

95. The PSTS of claim 94, wherein said CMOS detector is a photodiode array.

96. A parallel signal transfer system (PSTS) for reading a surface-enhanced Raman optical data storage (SERODS) medium comprising:

a laser providing an optical light beam to the SERODS medium, said laser adapted to produce a two-dimensional surface-enhanced Raman scattering (SERS) optical light image signal from the SERODS medium;

a beam splitter for splitting the optical light beam into first and second optical light beams;

a cylindrical mirror system positioned in the first optical light beam path, said cylindrical mirror system adapted for spreading the first optical light beam into a 2-D excitation plane;

an acousto-optic modulator positioned in the second optical light beam path, said acousto-optic modulator adapted for deflecting the second optical light beam;

an optical delay positioned in the second optical light beam path, said optical delay adapted for producing overlap with the first optical light beam for two-photon excitation in the SERODS medium;

a two-dimensional detector receiving the two-dimensional SERS optical light image signal, said two-dimensional detector adapted for producing a 2-D image of the 2-D SERS optical light image signal; and a holographic notch filter positioned between the SERODS medium and said two-dimensional detector, said holographic notch filter rejecting the Raleigh scatter from the two-dimensional SERS optical light image signal.

97. The PSTS of claim 96, further comprising a bandpass filter, said bandpass filter positioned in the two-dimensional SERS optical light image signal path from the SERODS medium.

98. The PSTS of claim 96, further comprising a tunable filter, said tunable filter positioned in the two-dimensional SERS optical light image signal path before said 2-D detector.

99. The PSTS of claim 96, wherein said 2-D detector is a charge coupled device camera.

100. The PSTS of claim 96, wherein said 2-D detector is a charge injection device.

101. The PSTS of claim 96, wherein said 2-D detector is a CMOS detector.

102. The PSTS of claim 101, wherein said CMOS detector is a photodiode array.

103. A parallel signal transfer system (PSTS) for reading a surface-enhanced Raman optical data storage (SERODS) medium comprising:

a laser providing a first optical light beam to the SERODS medium, said laser adapted to produce a two-dimensional surface-enhanced Raman scattering (SERS) optical light image signal from the SERODS medium;

a cylindrical mirror system positioned in the first optical light beam path, said cylindrical mirror system adapted for spreading the first optical light beam into a 2-D excitation plane;

a second laser providing a second optical light beam to the SERODS medium, said laser adapted to produce a two-dimensional surface-enhanced Raman scattering (SERS) optical light image signal from the SERODS medium;

an acousto-optic modulator positioned in the second optical light beam path, said acousto-optic modulator adapted for deflecting the second optical light beam;

an optical delay positioned in the second optical light beam path, said optical delay adapted for producing overlap with the first optical light beam for two-photon excitation in the SERODS medium;

a two-dimensional detector receiving the two-dimensional SERS optical light image signal, said two-dimensional detector adapted for producing a 2-D image of the 2-D SERS optical light image signal; and a holographic notch filter positioned between the SERODS medium and said two-dimensional detector, said holographic notch filter rejecting the Raleigh scatter from the two-dimensional SERS optical light image signal.

104. The PSTS of claim 103, further comprising a bandpass filter, said bandpass filter positioned in the two-dimensional SERS optical light image signal path from the SERODS medium.

105. The PSTS of claim 103, further comprising a tunable filter, said tunable filter positioned in the two-dimensional SERS optical light image signal path before said 2-D detector.

106. The PSTS of claim 103, wherein said 2-D detector is a charge coupled device camera.

107. The PSTS of claim 103, wherein said 2-D detector is a charge injection device.

108. The PSTS of claim 103, wherein said 2-D detector is a CMOS detector.

109. The PSTS of claim 108, wherein said CMOS detector is a photodiode array.

* * * * *